United States Patent
Reusswig et al.

(10) Patent No.: US 10,636,504 B2
(45) Date of Patent: Apr. 28, 2020

(54) READ VERIFY FOR IMPROVED SOFT BIT INFORMATION FOR NON-VOLATILE MEMORIES WITH RESIDUAL RESISTANCE

(71) Applicant: SanDisk Technologies LLC, Plano, TX (US)

(72) Inventors: Philip David Reusswig, Mountain View, CA (US); Nian Niles Yang, Mountain View, CA (US); Anubhav Khandelwal, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 102 days.

(21) Appl. No.: 15/798,648

(22) Filed: Oct. 31, 2017

(65) Prior Publication Data

US 2019/0130982 A1 May 2, 2019

(51) Int. Cl.
| | | |
|---|---|---|
| G11C 16/34 | (2006.01) | |
| G11C 16/04 | (2006.01) | |
| G11C 29/52 | (2006.01) | |
| G06F 11/10 | (2006.01) | |
| G11C 16/26 | (2006.01) | |

(52) U.S. Cl.
CPC ........ G11C 16/349 (2013.01); G06F 11/1012 (2013.01); G06F 11/1068 (2013.01); G11C 16/0483 (2013.01); G11C 16/26 (2013.01); G11C 29/52 (2013.01)

(58) Field of Classification Search
CPC ... G11C 16/349; G11C 16/0483; G11C 29/52; G11C 16/26; G11C 11/5671; G11C 2211/563; G06F 11/1068; G06F 11/1012

USPC .......................................................... 714/764
See application file for complete search history.

(56) References Cited

U.S. PATENT DOCUMENTS

| | | | |
|---|---|---|---|
| 5,541,496 A | * | 7/1996 | Simmonds ............ H02J 7/0091 320/151 |
| 7,023,735 B2 | | 4/2006 | Ban et al. |
| 7,502,254 B2 | | 3/2009 | Murin et al. |
| 7,821,826 B2 | * | 10/2010 | Shalvi ................. G11C 11/5642 365/185.01 |
| 7,944,749 B2 | | 5/2011 | Lee et al. |
| 7,966,546 B2 | | 6/2011 | Mokhlesi et al. |
| 7,966,550 B2 | | 6/2011 | Mokhlesi et al. |
| 8,004,900 B2 | | 8/2011 | Dutta et al. |
| 8,099,652 B1 | | 1/2012 | Alrod et al. |
| 8,145,981 B2 | | 3/2012 | Mokhlesi et al. |
| 8,787,094 B2 | | 7/2014 | Costa et al. |
| 8,867,271 B2 | | 10/2014 | Li et al. |
| 8,908,435 B2 | | 12/2014 | Li et al. |

(Continued)

*Primary Examiner* — James C Kerveros
(74) *Attorney, Agent, or Firm* — Vierra Magen Marcus LLP

(57) ABSTRACT

Over a period of operation, non-volatile memory can develop a residual resistance that is impractical to remove. For example, in a NAND string of memory cells, trapped charge may build up in a region between the bit lines and drain side select gates, so that even when all the devices of a NAND string are in an "on" state, the NAND string will not conduct. This effect will skew both hard bit data determinations, indicating the data state of a selected memory cell, and soft bit data determinations which may correlate to the reliability of the hard bit data. Techniques are described to factor in such excessive residual resistance when determining the soft bit data.

21 Claims, 22 Drawing Sheets

(56) References Cited

U.S. PATENT DOCUMENTS

| | | | |
|---|---|---|---|
| 9,019,775 B2 | 4/2015 | Costa et al. | |
| 9,070,475 B2 | 6/2015 | Sharon et al. | |
| 9,250,990 B2* | 2/2016 | Motwani | G06F 11/076 |
| 9,257,191 B1 | 2/2016 | Yuan et al. | |
| 9,318,194 B1 | 4/2016 | Siau et al. | |
| 9,343,159 B2 | 5/2016 | Dong et al. | |
| 9,484,114 B1 | 11/2016 | Ben-Rubi et al. | |
| 9,595,325 B2 | 3/2017 | Siau et al. | |
| 2010/0214830 A1* | 8/2010 | Franceschini | G11C 11/56 |
| | | | 365/163 |
| 2012/0221775 A1* | 8/2012 | Kim | G06F 21/00 |
| | | | 711/103 |
| 2013/0107611 A1* | 5/2013 | Cai | G11C 11/161 |
| | | | 365/158 |
| 2013/0176780 A1* | 7/2013 | Alhussien | G11C 16/04 |
| | | | 365/185.03 |
| 2013/0294145 A1* | 11/2013 | Sandhu | H01L 45/08 |
| | | | 365/148 |
| 2013/0322174 A1 | 12/2013 | Li et al. | |
| 2014/0208182 A1* | 7/2014 | Sakai | H03M 13/1117 |
| | | | 714/755 |
| 2014/0241056 A1* | 8/2014 | Wu | G11C 16/26 |
| | | | 365/185.03 |
| 2015/0089310 A1* | 3/2015 | Motwani | G06F 11/076 |
| | | | 714/704 |

* cited by examiner

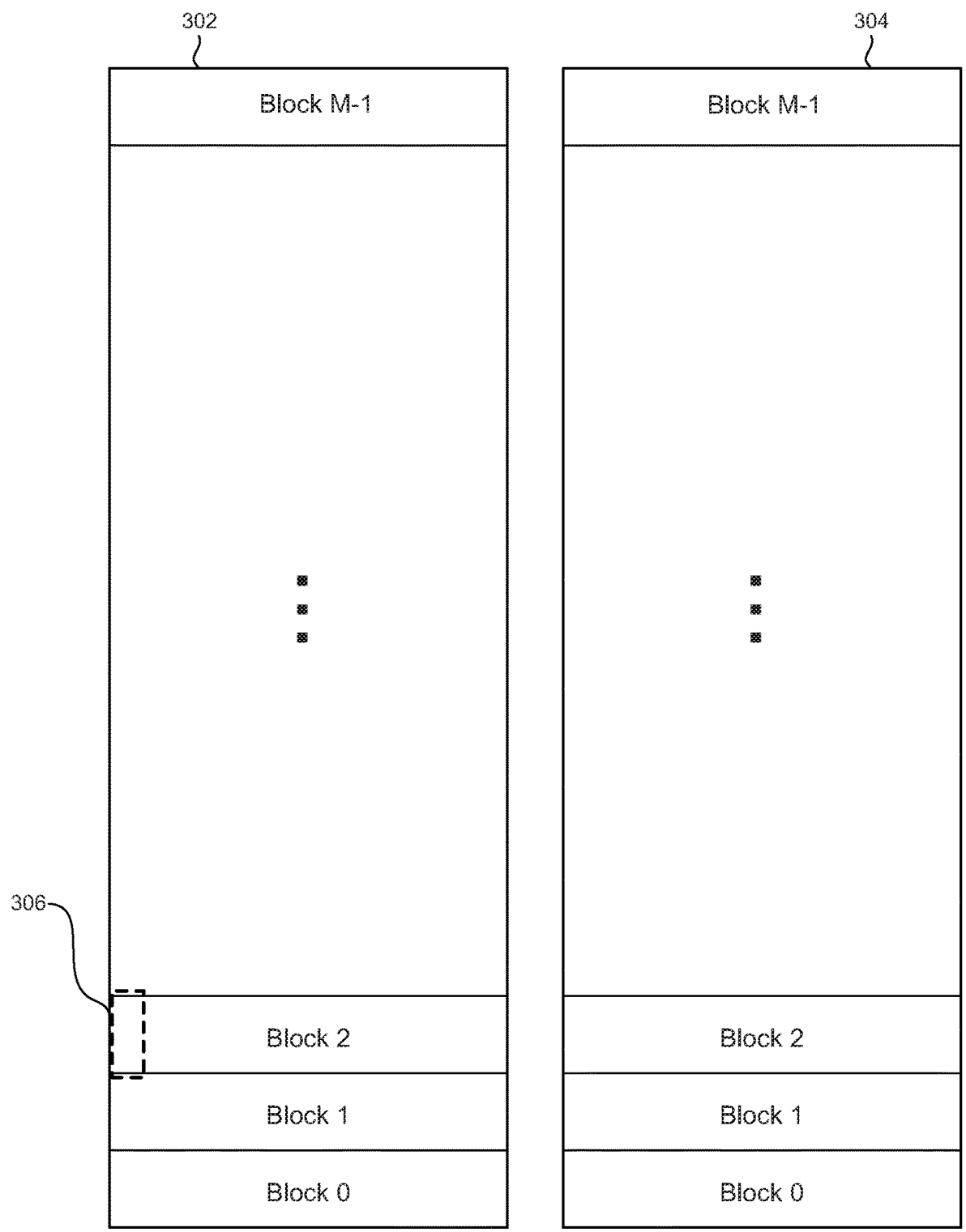

Figure 4D
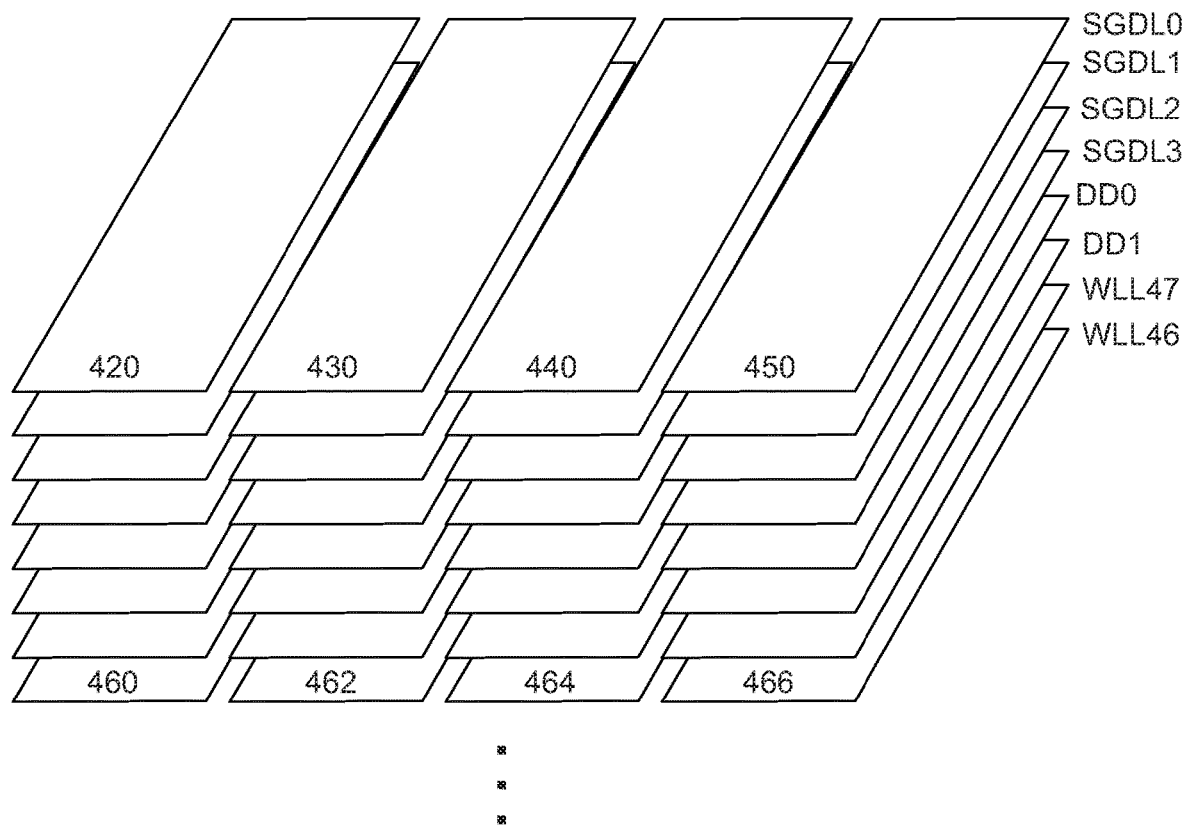
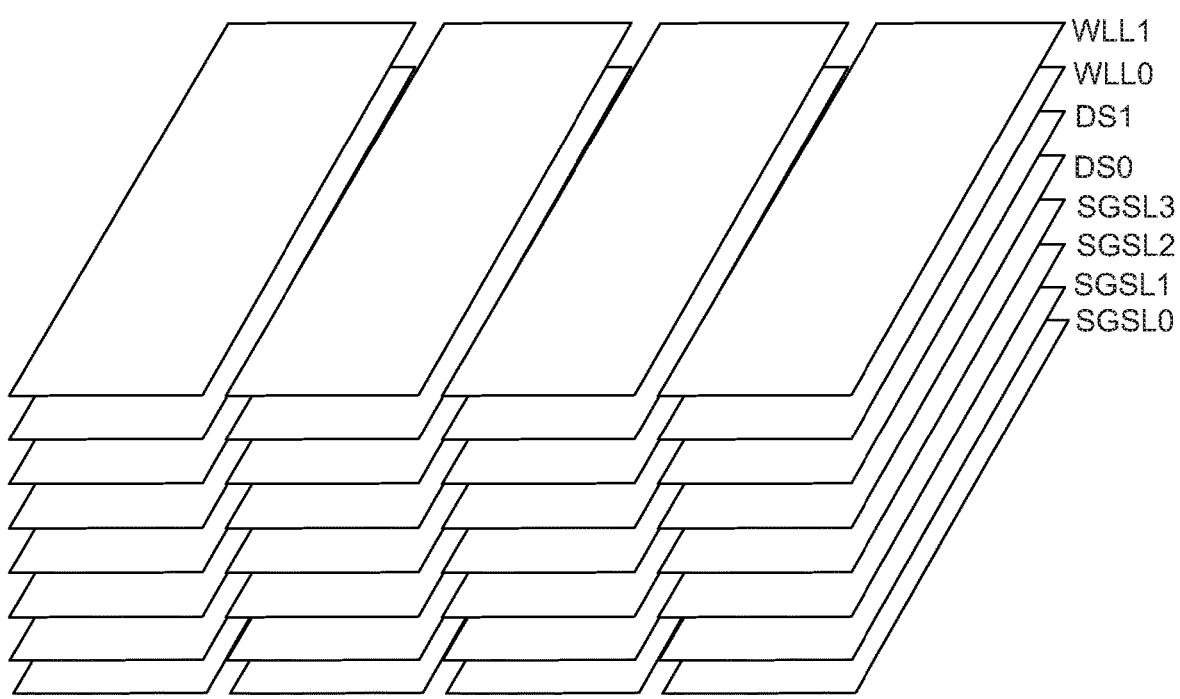

Figure 5
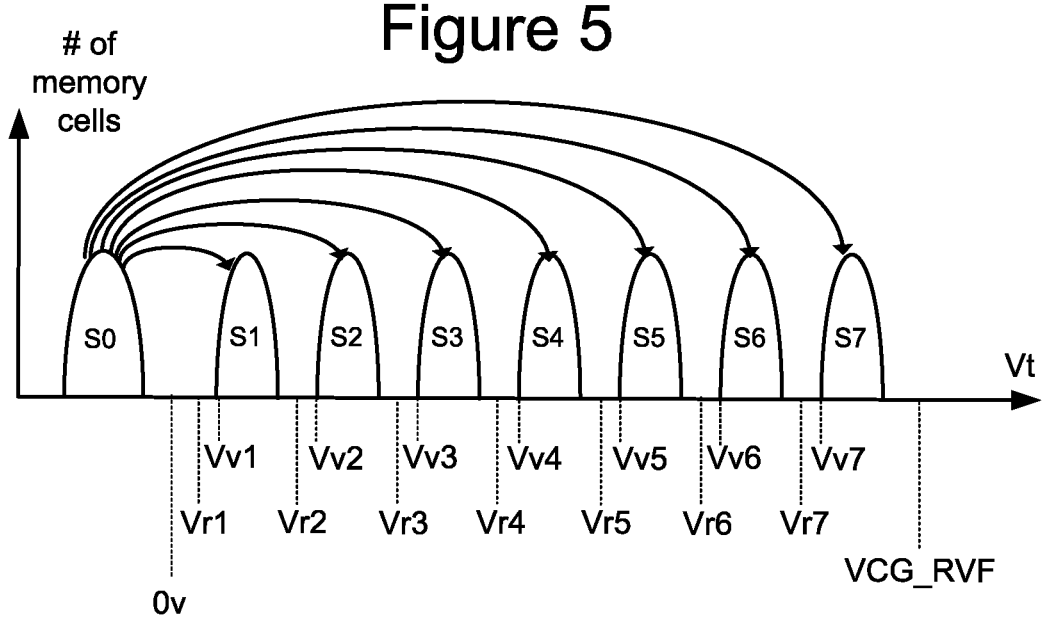
Figure 6
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
Figure 7C
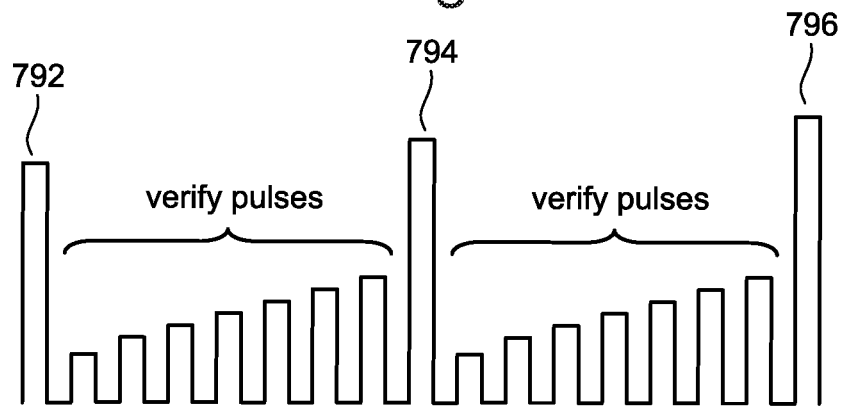

Figure 11

| | Erase Verify | | | | | | | |
|---|---|---|---|---|---|---|---|---|
| Datalatch Address | 0 | 1 | 2 | 3 | ... | N-3 | N-2 | N-1 | N |
| Datalatch Expected Erase Verify Value | 11111111 | 11111111 | 11111111 | 11111111 | ... | 11111111 | 11111111 | 11111111 | 11111111 |
| Datalatch Measured Erase Verify Value | 11111111 | 11111110 | 11111111 | 11110111 | ... | 01111111 | 11111111 | 11111111 | 10111111 |

Figure 12C

| | HB and SB Read | | | | | | | | |
|---|---|---|---|---|---|---|---|---|---|
| Datalatch Address | 0 | 1 | 2 | 3 | ... | 18333 | 18334 | 18335 | 18336 |
| Datalatch Expected HB Read Value | xxxxxxxx | xxxxxxx1 | xxxxxxxx | xxxx0xxx | ... | 1xxxxxxx | xxxxxxxx | xxxxxxxx | xx1xxxxx |
| Datalatch Measured HB Read Value | xxxxxxxx | xxxxxxx0 | xxxxxxxx | xxxx0xxx | ... | 0xxxxxxx | xxxxxxxx | xxxxxxxx | xx0xxxxx |
| Datalatch Measured SB+ Read Value | xxxxxxxx | xxxxxxx0 | xxxxxxxx | xxxx0xxx | ... | 0xxxxxxx | xxxxxxxx | xxxxxxxx | xx0xxxxx |
| Datalatch Measured SB- Read Value | xxxxxxxx | xxxxxxx0 | xxxxxxxx | xxxx0xxx | ... | 0xxxxxxx | xxxxxxxx | xxxxxxxx | xx0xxxxx |
| Datalatch Measured SB Value | xxxxxxxx | xxxxxxx1 | xxxxxxxx | xxxx1xxx | ... | 1xxxxxxx | xxxxxxxx | xxxxxxxx | xx1xxxxx |
| Result | | HE | | RCB | | HE | | | HE |

READ VERIFY FOR IMPROVED SOFT BIT INFORMATION FOR NON-VOLATILE MEMORIES WITH RESIDUAL RESISTANCE

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

As memory structures increase in density, it becomes more challenging to maintain the integrity of the data being stored. One way to maintain data integrity is through use of Error Correction Codes (ECC). However, error correction codes can only handle a limited amount of error and data retention can be further improved by increasing the effectiveness of ECC techniques.

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 5 depicts threshold voltage distributions.

FIG. 6 is a table describing one example of an assignment of data values to data states.

FIG. 7C depicts a word line voltage during programming and verify operations.

FIG. 11 illustrates an example of erase verify results when several NAND strings fail to verify as erased.

FIG. 12C is a table illustrating the different read results and their consequences for NAND strings suffering from residual resistance.

DETAILED DESCRIPTION

Figure 1A:
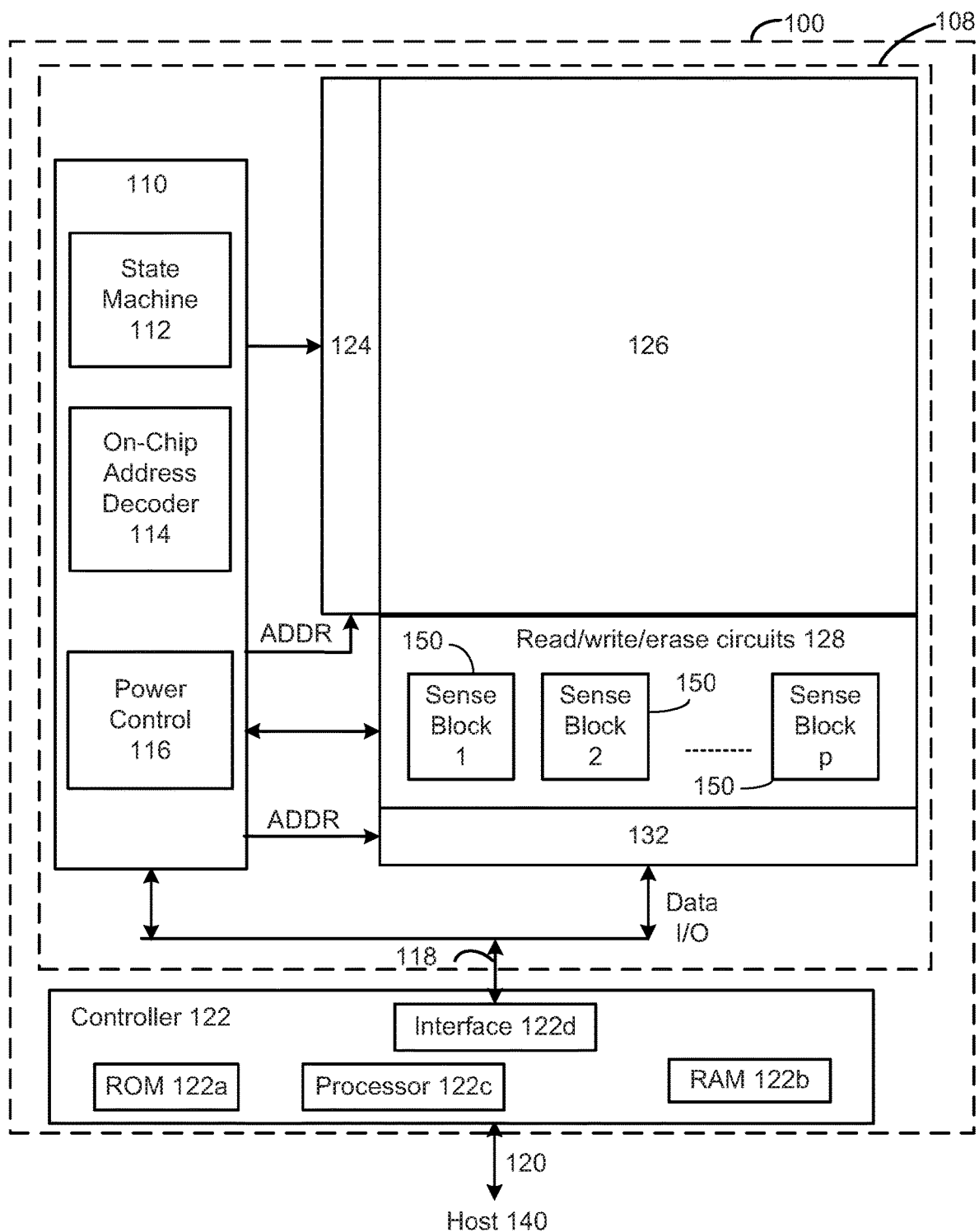
FIG. 1A is a functional block diagram of a memory device.

In a typical NAND memory structure, a number of memory cells are connected in series between select gates. To read a selected memory cell of a NAND string, the select gates and non-selected memory cells are biased to be in a conducting state, and the selected memory cell is biased with a read voltage. Whether the memory cell, and the NAND string as a whole, conducts, depends on whether the read voltage is above the selected memory cell's threshold voltage. However, if an additional, uncontrollable resistance is introduced into the NAND string, the NAND string may not conduct even when all of the select gates and memory cells are on. Such a situation can occur if charge becomes trapped along a charge trapping region of the NAND string that is not located under the select or memory cell transistors, such as in the regions at the end of the NAND strings between the drain side select transistors and the bit lines. This can cause the channel of the NAND string to have a reduced performance level due to an excessive amount of residual resistance. The residual resistance is a level of electrical resistance in the NAND string when all of the select transistors and all of the memory cells of the NAND string are biased to be in an "on" state, regardless of the data states stored on the memory cells, so that the NAND string should be conducting, but instead electrical resistance in the NAND string prevents the NAND string from conducting. Depending upon the severity of the residual resistance, under the available bias conditions the NAND string may not conduct at all, or the level of conduction may be so low as to register as non-conducting in a sensing operation. For example, in an embodiment where a sensing operation involves pre-charging a bit line and then allowing the bit line to discharge through the NAND string over a sensing interval, the residual resistance may result in the amount of discharge being so small that the NAND string registers as non-conducting. Unless the read results are rectified, this residual resistance can throw off both hard bits, indicating the data state stored in a memory cell, and soft bits, indicating the reliability of the hard bit data. If enough of these errors are accumulated, they can eventually overwhelm the error correction capabilities of the memory system.

The following presents techniques for determining whether a NAND string suffers from reduced performance due to such excessive residual resistance and, if so, rectify the read results. An additional read, or "read verify", operation, where a sensing operation with all transistors of a NAND turned on, is used to determine NAND strings with residual resistance above a reference value. The results of the read verify can then be used to determine whether to downgrade the soft bit information, an indication of the reliability of a memory cell's read, for memory cells in a NAND string with excessive residual resistance, such as above a reference level. For error correction codes, such as low-density parity check (LDPC) codes, that use soft bit information, this downgrading can lead to more accurate data decoding.

FIGS. 1A-4F describe one set of examples of a memory system that can be used to implement the technology proposed herein. FIG. 1A is a functional block diagram of an example memory device. The components depicted in FIG. 1A are electrical circuits. Memory device 100 includes one or more memory die 108. Each memory die 108 can include two or three dimensional memory structure 126 of memory cells (such as, for example, a 3D array of memory cells), control circuitry 110, and read/write/erase circuits 128. In other embodiments, a two dimensional array of memory cells can be used. Memory structure 126 is addressable by-word lines via a row decoder 124 and by bit lines via a column decoder 132. The read/write/erase circuits 128 include multiple sense blocks 150 including Sense Block 1, Sense Block 2, . . . , Sense Block p (sensing circuitry) and allow a page of memory cells (connected to the same word line) to be read or programmed in parallel. In some systems, a controller 122 is included in the same memory device 100 as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

On-chip control circuitry 110 cooperates with the read/write/erase circuits 128 to perform memory operations (e.g., erase, program, read, and others) on memory structure 126, and includes a state machine 112 and/or other logic in the microcontroller, an on-chip address decoder 114, and a power control module 116. The state machine 112 provides die-level control of memory operations, such as programming different memory cells to different final targets for a common data state based on distance to an edge of a word line layer. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, also described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write/erase circuits 128, and/or controller 122 can be considered a control circuit that performs the functions described herein.

The (on-chip or off-chip) controller 122 (which in one embodiment is an electrical circuit) may comprise one or more processors 122c, ROM 122a, RAM 122b, and Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described below related to programming different memory cells to different final targets for a common data state based on distance to an edge of a word line layer. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. The controller can maintain various operating parameters in RAM 122b. As discussed further below, for example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
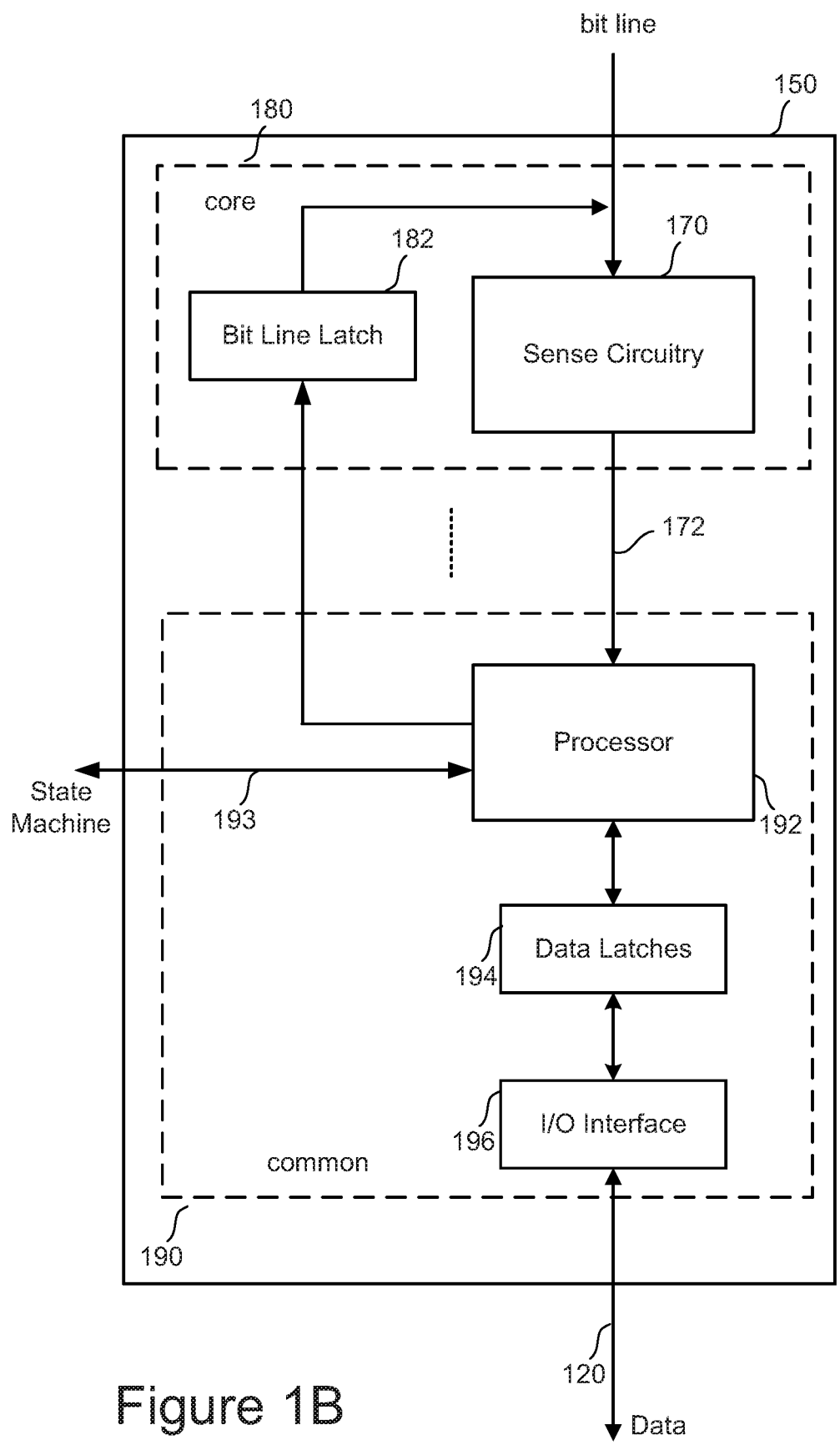
FIG. 1B a block diagram depicting one embodiment of a sense block.

FIG. 1B is a block diagram of an individual sense block 150 partitioned into a core portion, referred to as a sense module 180, and a common portion 190. In one embodiment, there will be a separate sense module 180 for each bit line and one common portion 190 for a set of multiple sense modules 180. In one example, a sense block will include one common portion 190 and eight sense modules 180. Each of the sense modules in a group will communicate with the associated common portion via a data bus 172.

Sense module 180 comprises sense circuitry 170 that determines whether a conduction current in a connected bit line is above or below a predetermined level. In some embodiments, sense module 180 includes a circuit commonly referred to as a sense amplifier. Sense module 180 also includes a bit line latch 182 that is used to set a voltage condition on the connected bit line. For example, a predetermined state latched in bit line latch 182 will result in the connected bit line being pulled to a state designating program inhibit (e.g., Vdd).

Common portion 190 comprises a processor 192, a set of data latches 194 and an I/O Interface 196 coupled between the set of data latches 194 and data bus 120. Processor 192 performs computations. For example, one of its functions is to determine the data stored in the sensed memory cell and store the determined data in the set of data latches. The set of data latches 194 is used to store data bits determined by processor 192 during a read operation. It is also used to store data bits imported from the data bus 120 during a program operation. The imported data bits represent write data meant to be programmed into the memory. I/O interface 196 provides an interface between data latches 194 and the data bus 120.

During read or sensing, the operation of the system is under the control of state machine 112 that controls the supply of different control gate voltages to the addressed cell. As it steps through the various predefined control gate voltages (the read reference voltages or the verify reference voltages) corresponding to the various memory states supported by the memory, the sense module 180 may trip at one of these voltages and an output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194. In another embodiment of the core portion, bit line latch 182 serves double duty, both as a latch for latching the output of the sense module 180 and also as a bit line latch as described above.

It is anticipated that some implementations will include multiple processors 192. In one embodiment, each processor 492 will include an output line (not depicted in FIG. 1B) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 192 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 194 from the data bus 120. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 192 monitors the verified memory state relative to the desired memory state. When the two are in agreement, processor 192 sets the bit line latch 182 so as to cause the bit line to be pulled to a state designating program inhibit. This inhibits the memory cell coupled to the bit line from further programming even if it is subjected to programming pulses on its control gate. In other embodiments the processor initially loads the bit line latch 182 and the sense circuitry sets it to an inhibit value during the verify process.

Data latch stack 194 contains a stack of data latches corresponding to the sense module. In one embodiment, there are three (or four or another number) data latches per sense module 180. In some implementations (but not required), the data latches are implemented as a shift register so that the parallel data stored therein is converted to serial data for data bus 120, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Figure 1C:
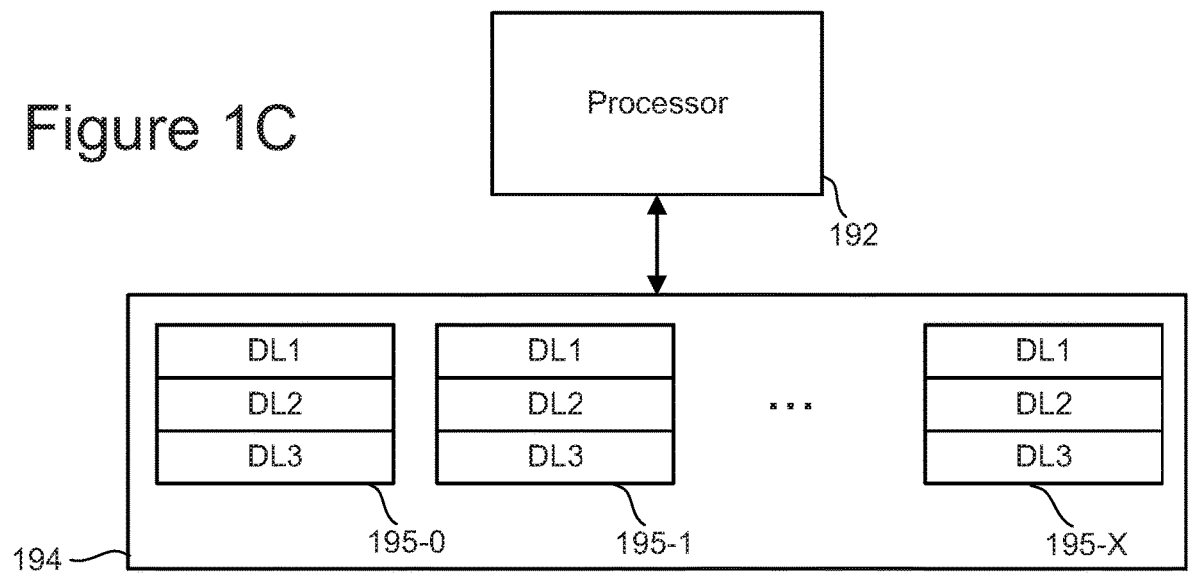
FIG. 1C shows an example implementation of data latches.

FIG. 1C shows an example implementation of data latches 194, including a set of latches 195-0, 195-1, . . . , 195-X for each bit line. Each set of latches includes three latches DL1, DL2 and DL3. In other embodiments, each set of latches has more or less than three latches.

Figure 2:
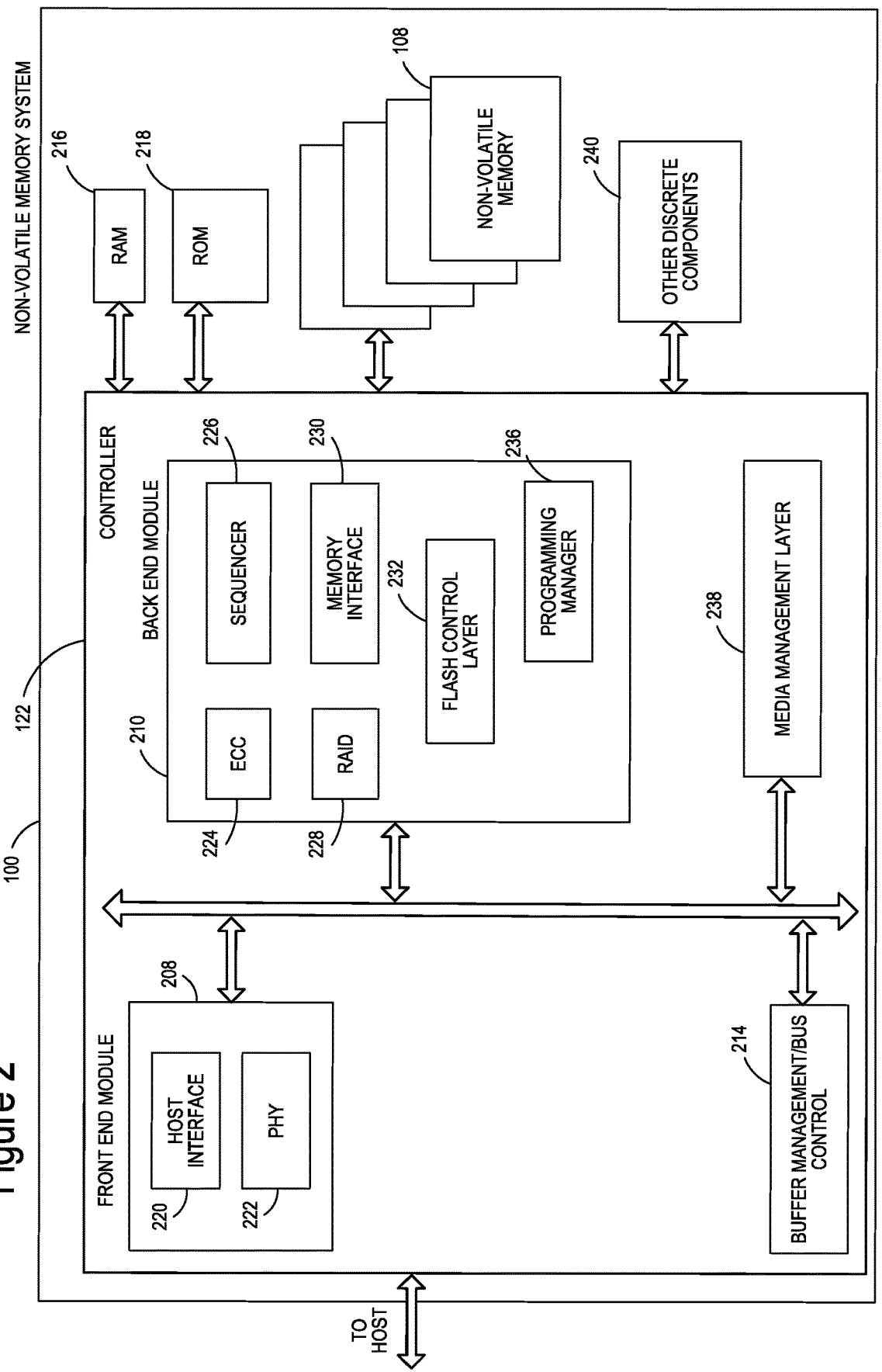
FIG. 2 is a block diagram depicting one embodiment of a memory system.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 112 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1A (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. The ECC engine 224 has one or more decoders. In one embodiment, the ECC engine 224 comprises a low-density parity check (LDPC) decoder. In one embodiment, the decoders of the ECC engine can include a hard decoder and a soft decoder. An output of the one or more decoders may be provided to the host. The controller may be configured to receive hard bit values and soft bit values from the non-volatile memory 108.

Hard bit values are derived from reading memory cells at hard bit read reference levels. Soft bit values are derived from reading memory cells at soft bit read reference levels. In one embodiment, hard bit values are input to a hard decoder. In one embodiment, hard bit values and soft bit values are input to a soft decoder.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a programming manager 236, which can be used to manage (in conjunction with the circuits on the memory die) the programming of memory cells closer to an edge of the word line layer and memory cells further from the edge of the word line layer to a first data state representing first data such that the memory cells closer to the edge of the word line layer are programmed to a first final threshold voltage distribution using a first final verify level and the memory cells further from the edge of the word line layer are programmed to a second final threshold voltage distribution using a second verify level, where the second verify level is lower than the first verify level and the second final threshold voltage distribution is lower in voltage than the first threshold voltage distribution. For example, in one embodiment, programming manager 236 may perform and/or manage the processes of FIGS. 7A, 12, 14 and 15, described below. More details of programming manager 236 are also provided below with respect to those figures. Programming manager 236 can be an electrical circuit, a set of one or more software modules, or a combination of a circuit and software.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
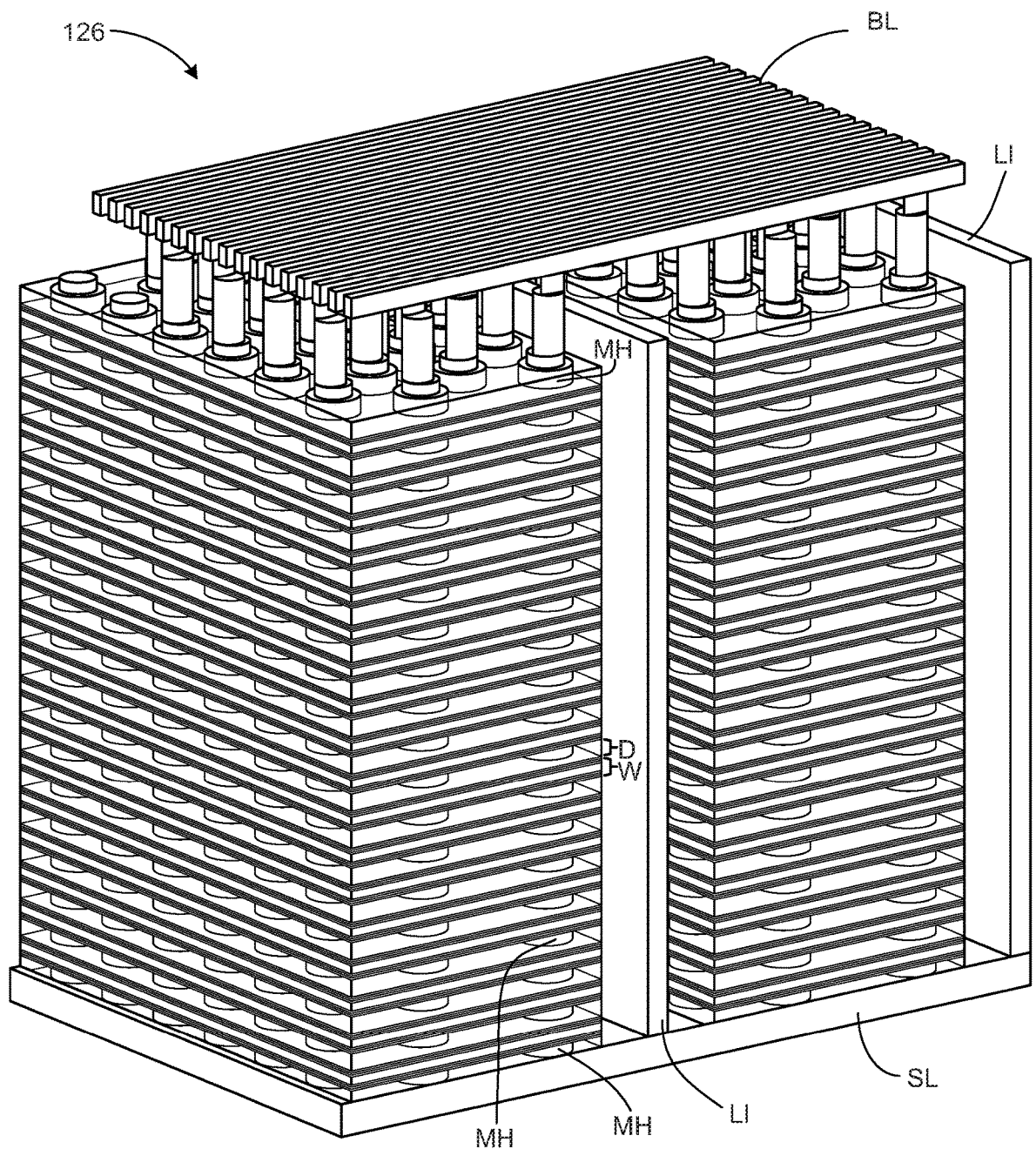
FIG. 3 is a perspective view of a portion of one embodiment of a monolithic three dimensional memory structure.

FIG. 3 is a perspective view of a portion of one example embodiment of a monolithic three dimensional memory structure 126, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below the alternating dielectric layers and word line layers is a source line layer SL. Memory holes are formed in the stack of alternating dielectric layers and conductive layers. For example, one of the memory holes is marked as MK. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
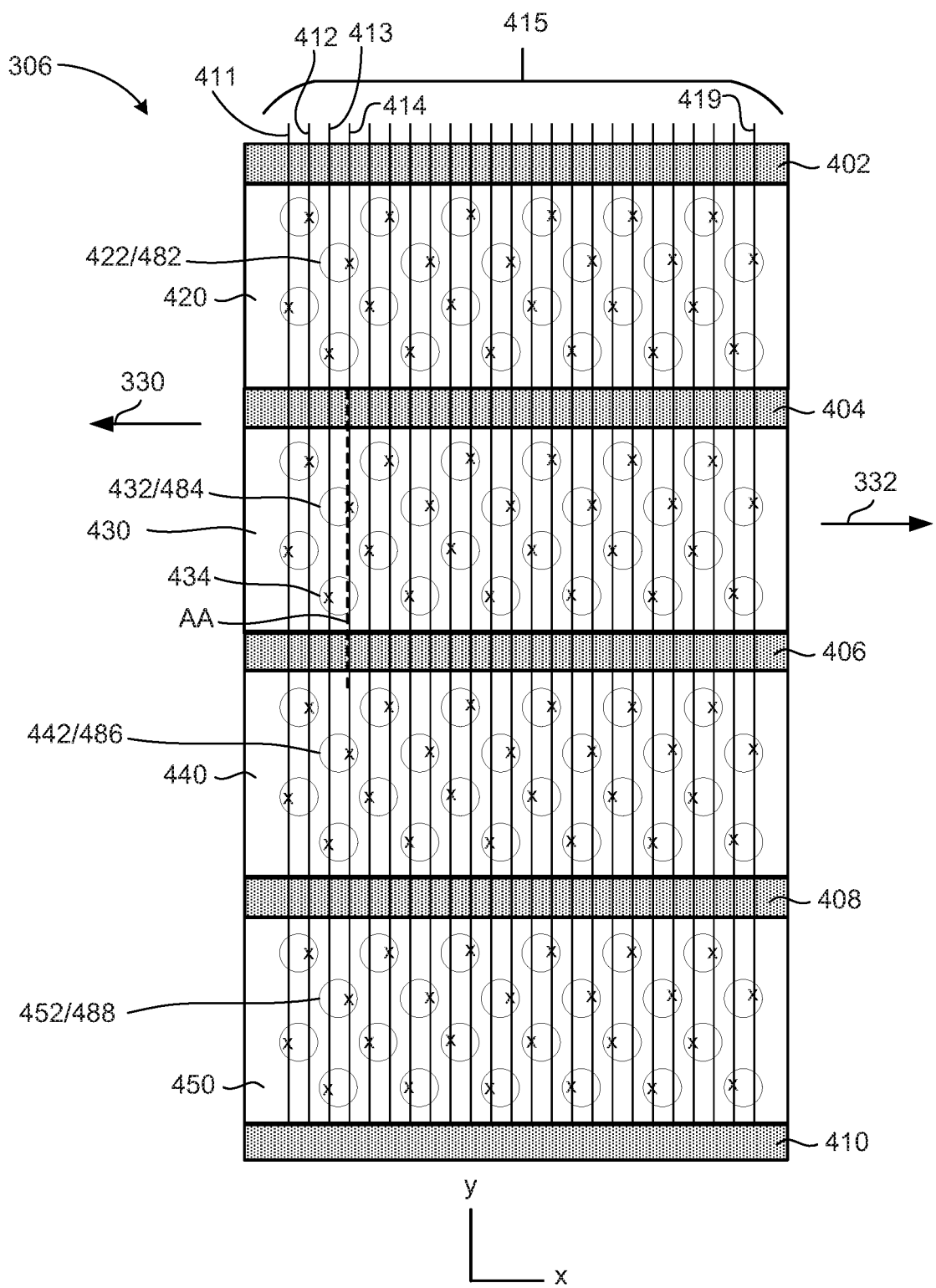
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string and, therefore, can be referred to as a memory column. A memory column can implement other types of memory in addition to NAND. FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of isolation areas 402, 404, 406, 408 and 410 that serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the isolation areas (also serving as local interconnects). In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Isolation areas 402, 404, 406, 408 and 410 also connect the various layers to a source line below the vertical columns. In one embodiment, isolation areas 402, 404, 406, 408 and 410 are filled with a layer of $SiO_2$ (blocking) and a layer of poly-silicon (source line connection).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
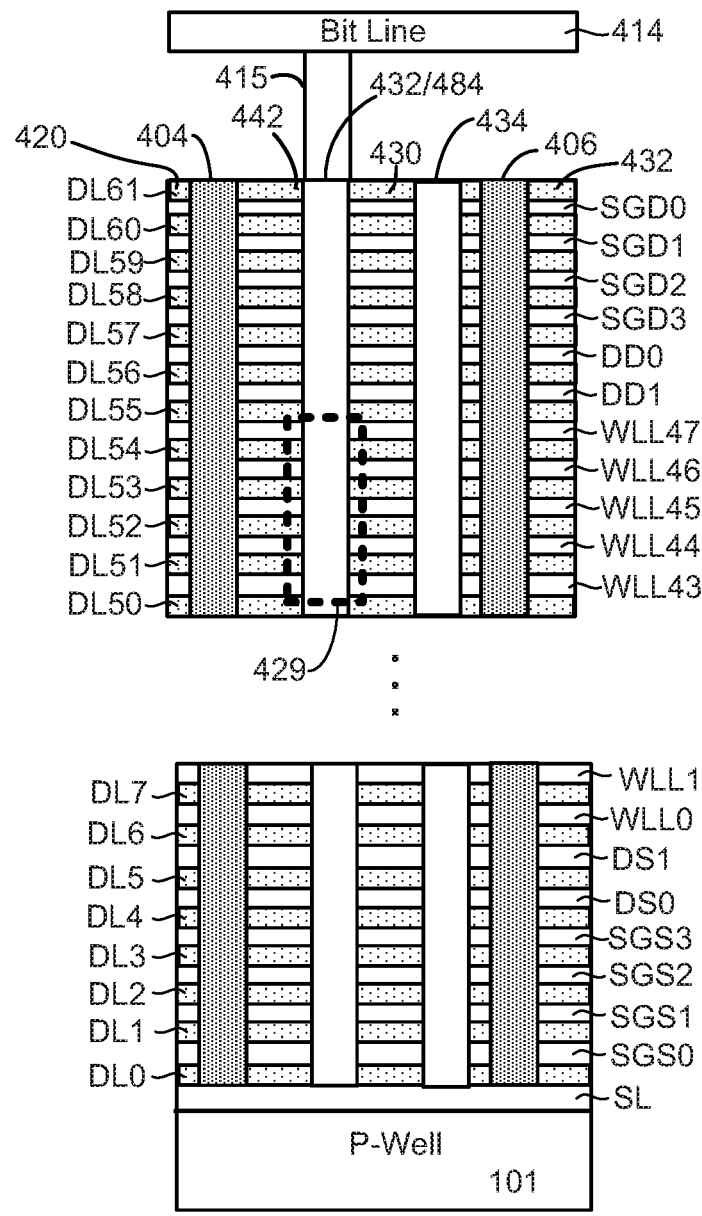
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. The NAND string of vertical column 432 has a source end at a bottom of the stack and a drain end at a top of the stack. As in agreement with FIG. 4B, FIG. 4C show vertical column 432 connected to Bit Line 414 via connector 415. Isolation areas 404 and 406 are also depicted. Below the vertical columns and the layers listed below, and over the underlying substrate, is source line SL and well region P-Well 101. A block of memory cells will share a common well region and in an erase operation, the erase voltage Verase is applied to the P-Well 101 and, through the source line SL, to channel region of the vertical columns.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL61. For example, dielectric layers DL51 is above word line layer WLL43 and below word line layer WLL44. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment isolation areas 402, 404, 406, 408 and 410 break up each of the conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
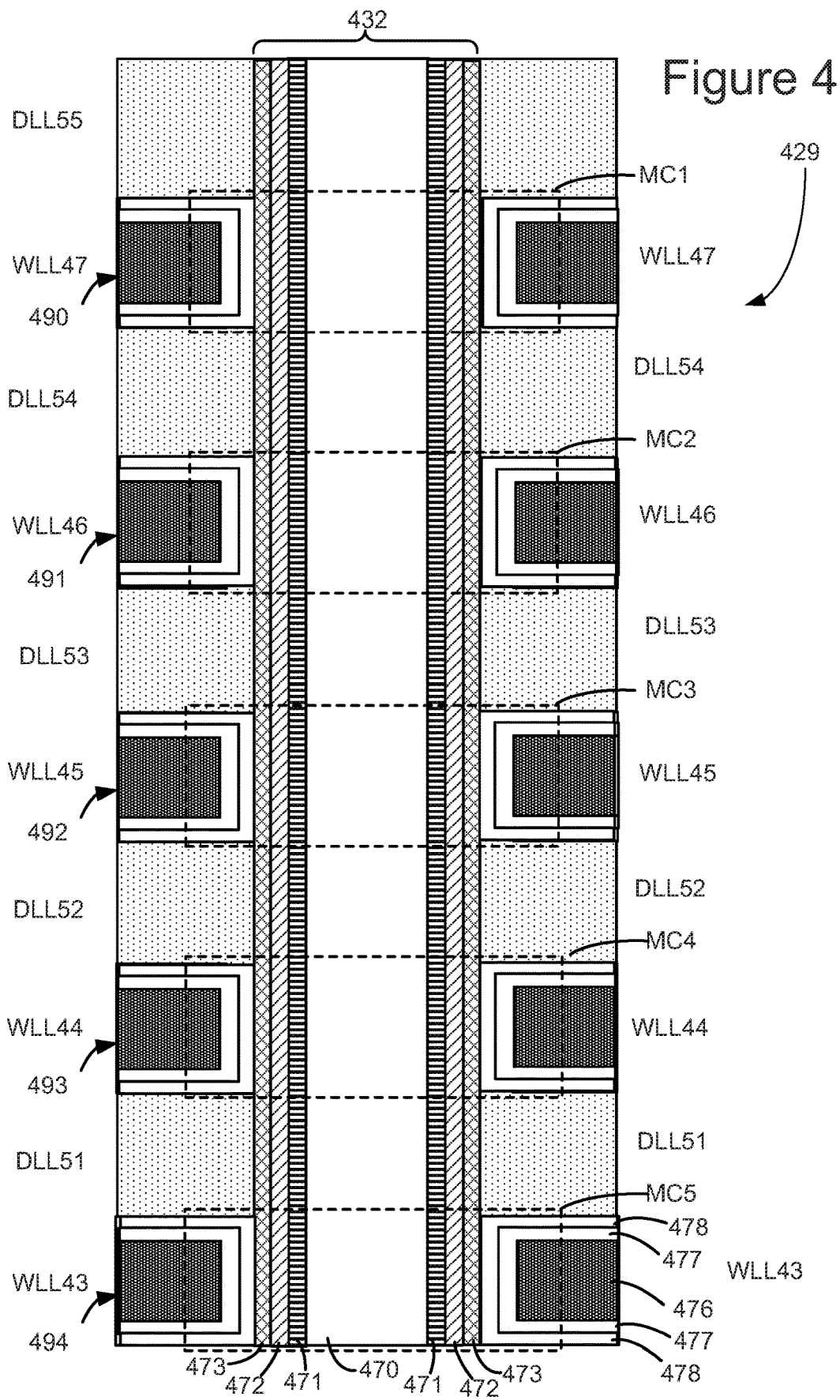
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as SiO$_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL51, DLL52, DLL53, DLL54 and DLL55, as well as word line layers WLL43, WLL44, WLL45, WLL46, and WLL47. Each of the word line layers includes a word line region 476 surrounded by an aluminum oxide layer 477, which is surrounded by a blocking oxide (Sift) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
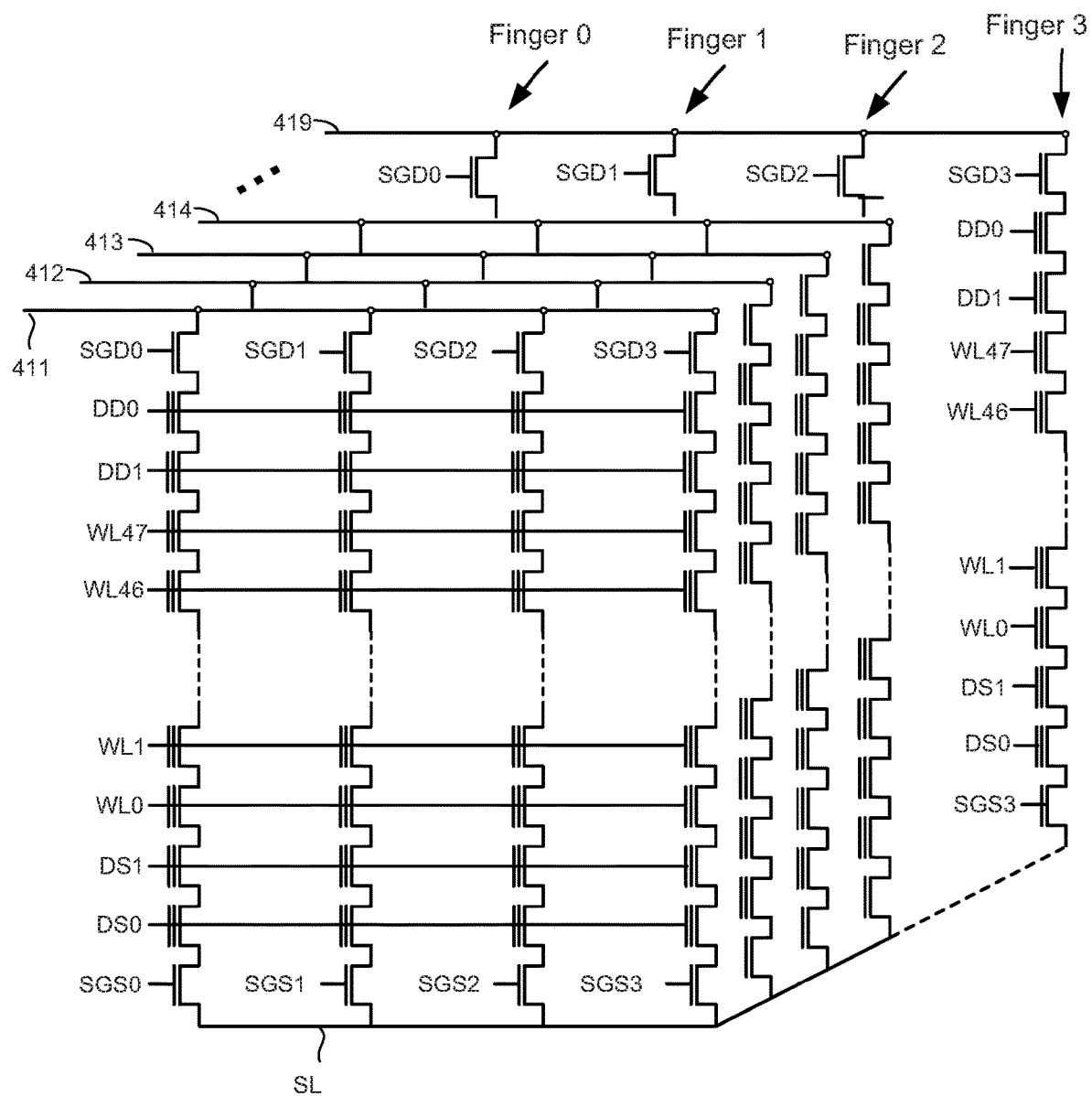
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four fingers finger 0, finger 1, finger 2 and finger 3. Finger 0 corresponds to those vertical NAND strings controlled by SGD0 and SGS0, finger 1 corresponds to those vertical NAND strings controlled by SGD1 and SGS1, finger 2 corresponds to those vertical NAND strings controlled by SGD2 and SGS2, and finger 3 corresponds to those vertical NAND strings controlled by SGD3 and SGS3.

Although the example memory system of FIGS. 4A-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, ... ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

FIG. 5 also illustrates a "read verify" voltage, VCG_RVF, that can be used as part of a read verify operation, as is described further below with respect to FIG. 13A and subsequent figures. The read verify voltage is selected to turn on a memory cell for any of the data states that it may be storing. In some embodiments this can be the same as the read pass value used for non-selected memory cells in a sensing operation, while in other embodiments it can be a separate voltage level.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 6 is a table describing one example of an assignment of data values to data states. In the table of FIG. 6, S0-111. S1=110, S2=200, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

Figure 7A:
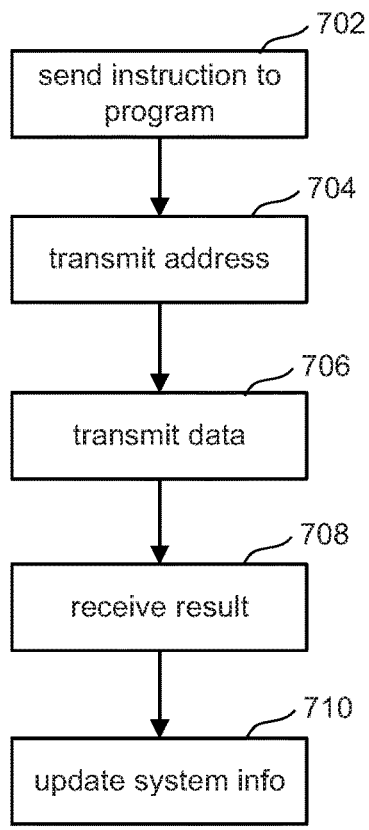
FIG. 7A is a flow chart describing one embodiment of a process for programming.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. controller can also scramble the data to achieve wear leveling with respect to the memory cells.

Figure 7B:
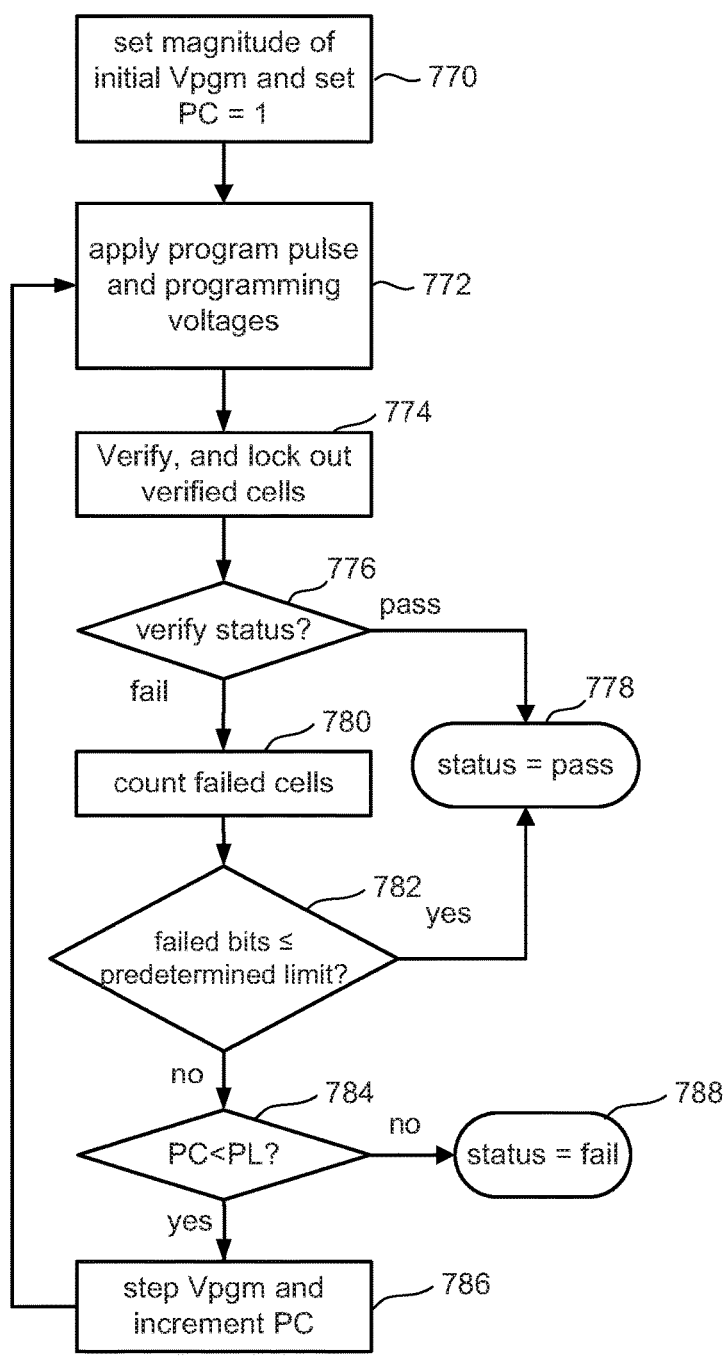
FIG. 7B is a flow chart describing one embodiment of a process for programming data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of FIG. 7B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner, all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units. For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Looking back at FIG. 4B, the memory structure is depicted with four rows of memory holes between isolation areas 402, 404, 406, 408 and 410. In some embodiments, when memory cells are further scaled down, one approach is to reduce the number of isolation areas which are used to separate fingers or increase the number of memory holes without increasing the number of isolation areas. The isolation areas are also used to let in etchant to etch away silicon nitride (SiN) layers inside the multiple oxide/nitride layer stack and replace them with tungsten layers which will be used as word line layers. That is when the memory stack is first fabricated, alternating layers of dielectric material (oxide) and silicon nitride are deposited or otherwise laid down. Then the memory holes are created through the alternating layers of oxide/nitride. Various materials that make up the memory holes are then added, as depicted in FIG. 4E. Then the isolation areas are carved into the stack. Subsequently, an etchant is inserted via the insolation areas in order to etch out the silicon nitride. Once the silicon nitride is removed, tungsten is used to replace the silicon nitride. This tungsten will become the word line layers.

If the number of isolation areas is reduced as compared to the number of memory holds, it means more memory holes will exist between every two neighboring isolation areas. This also means larger areas of silicon nitride need to be etched away and replaced by tungsten between every two neighboring isolation areas and, therefore, the silicon nitride etching process will take a longer time. Since the silicon nitride layers surrounding the outer memory holes (memory holes which are closer to the isolation areas) will be etched earlier by the etchant (typically hot phosphoric acid) coming in from vertically etched through isolation areas, while the silicon nitride layers surrounding the inner memory holes (memory holes which are closer to the isolation areas) will be etched later, the dielectric layers (Sift layers) inside the outer memory holes will be exposed to the etchant for a longer time. Due to this exposure difference, the $SiO_2$ layers of the outer memory holes will be etched away more than that of the inner memory holes. This will cause thinner dielectric layer thickness inside the outer memory holes which leads to faster memory cell programming and erasing. It will also lead to comparatively thicker dielectric layer thickness for the inner memory holes which leads to slower memory programming and erase speeds.

When programming the memory cells as described above, prior to applying a program pulse at step 772 of FIG. 7B, if a memory cell should be programmed, then the corresponding bit line is grounded. On the other hand, if the memory cell should remain at its current threshold voltage, then the corresponding bit line is connected to a program inhibit level, such as Vdd. In many embodiments, the word lines of an erased block are programmed stating at the source end with word line word line WL0 of FIG. 4A-4F. As the other memory cells of the columns between the selected word line and the bit line are erased, this allows for the level on the bit line to be applied to the memory cells of the selected word line uniformly, whereas if any of the intermediate memory cells were programmed, this pre-charging of the memory cells could be blocked. The word lines of the block are then sequentially written in an order working from the source side on the bottom towards the bit lines at the drain end of the NAND strings.

Figure 8A:
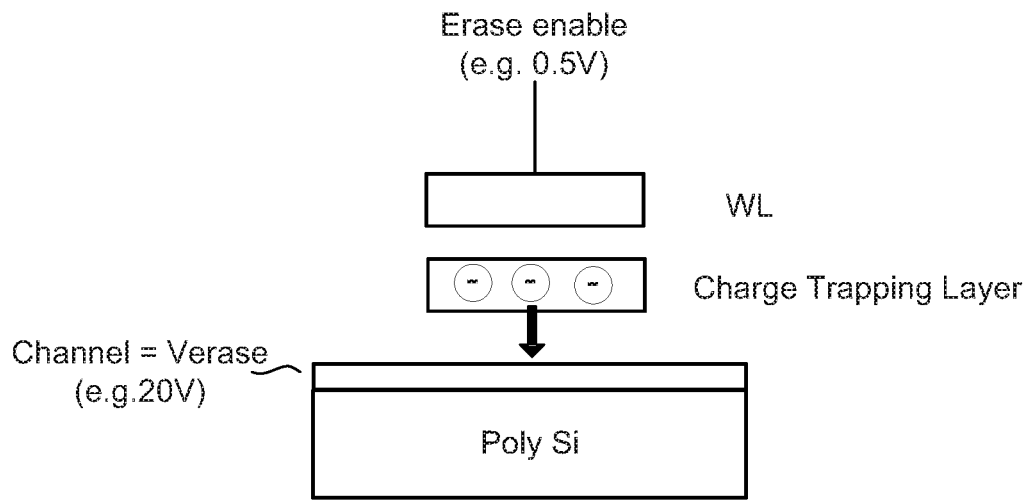
FIGS. 8A and 8B respectively illustrate an erase enabled and an erase inhibited memory cells in the structure of FIGS. 4A-4F.

In an erase process for a 3D NAND structure, such as illustrated in FIGS. 3 and 4A-4F, an erase operation is performed by applying an erase voltage to the channel region while setting the word lines to an erase enable level. For example, the erase enable level of ground or other low voltage value, such as 0.5V or more generally in the range of 0-1.0V, for example. FIG. 8A illustrates this for a single memory cell of the structure as in FIGS. 4C and 4E, but with the view rotated so that a column would now run left to right. With the word line setting the control gate to an erase enable voltage, the erase voltage is applied to the channel region from the P-Well (101 of FIG. 4C), through the source line SL to channel region (471 of FIG. 4F) around the column's inner core. By setting the channel region to an erase voltage of, for example, Verase=20-25V, an electrical field is formed across the charge trapping layer, pulling the charge off to the channel. This is similar the case of a 2D flash memory where the memory cells of a block are laid out in a horizontal array over a common well structure and the erase process pulls the charge off of the floating gates, except that in the 2D case the change is pulled directly down into the well structure by the erase voltage, whereas in the 3D case the charge is pulled in the channel region of the column, and then down the column to towards the well.

Figure 8B:
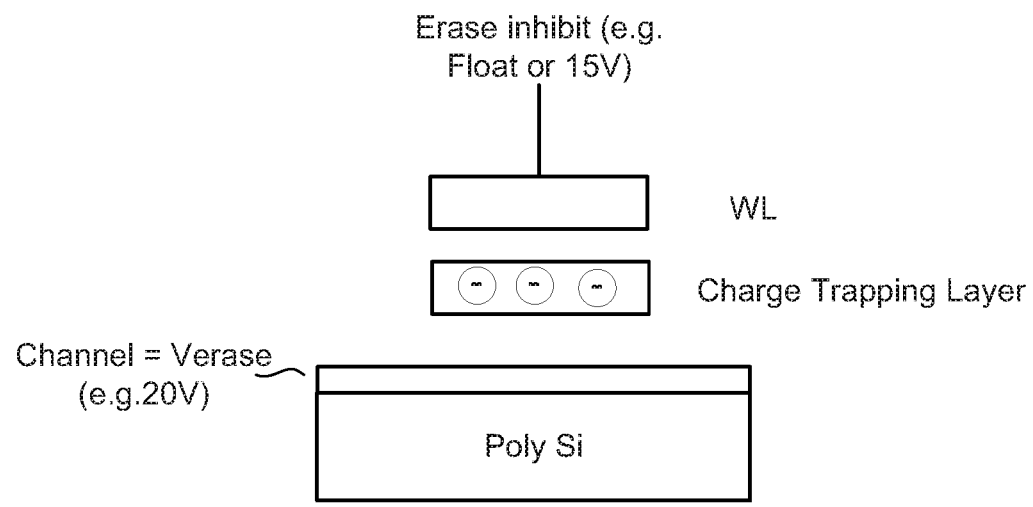

Although flash memory, including the 3D structure of FIGS. 3 and 4A-4F, is commonly erased at the block level, there may be some elements that are not wanted to be erased, such as dummy word lines or select gates. As illustrated in FIG. 8A, to erase programmable transistors along a word line or other control line, the line is set to the erase enable level of ground or other low voltage so that when erase voltage is applied to channel, the desired voltage level is applied across the charge storage region. If, instead, a word line or select line is at an erase inhibit level of a relatively high voltage (~15V, for example) as illustrated in FIG. 8B, the memory cell will not be subjected to the same strength of electric filed across its charge storage region. This can be done by either applying a direct bias to the word line or by capacitive coupling of the word line to the well structure. If a select gate control line or word line is left to float, when the erase voltage is applied to the well structure, the word lines is pulled up through capacitive coupling to the block's well structure, so that a much lower voltage differential is applied across the charge storage regions of these cells. Consequently, even though a block is undergoing an erase operation, some word lines, such as dummy word lines, or select gate lines can be selected for erase and others non-selected. More detail on erase and erase inhibit is described in US patent publication 2016/0180939, which is hereby incorporated herein by reference in its entirety. In the following discussion, non-selected memory cells, such as dummy cells, or select gates of a block will be erase inhibited by leaving their word lines to float, although other embodiments can use direct bias for non-selected word lines.

Referring back to FIG. 4E, the memory cells are programmed by increasing the amount of charge stored in the charge trapping layer 473 under a memory cell's control gate and erased by removing the amount of charge stored under the control gate. The trapped charge increases the NAND string resistance, which is overcome by applying a read voltage along the memory cell's corresponding word line. If charge becomes trapped in areas of the charge trapping layer that is not under a memory cell or select gate, this will also increase the resistance of the NAND string; however, if the trapped charge in not under or near a control gate for a select gate or memory cell, the may device may be unable to either fully turn on this region of the channel or erase this trapped charge, resulting in a residual resistance and reduced performance of the NAND string. For example, if there is a relatively large gap between word lines or in a stretch of the NAND string above the top-most select gates, this can lead a section of the charge trapping layer that can neither be controlled nor erased if trapped charge accumulates there. Also, although the NAND memory cell structures described with respect to FIGS. 3-4F use a charge trapping region, in the case of floating gate memory cells un-erasable charge may also accumulate in the dielectric layers above and below the floating gate structures and other regions along the NAND string.

Figure 9:
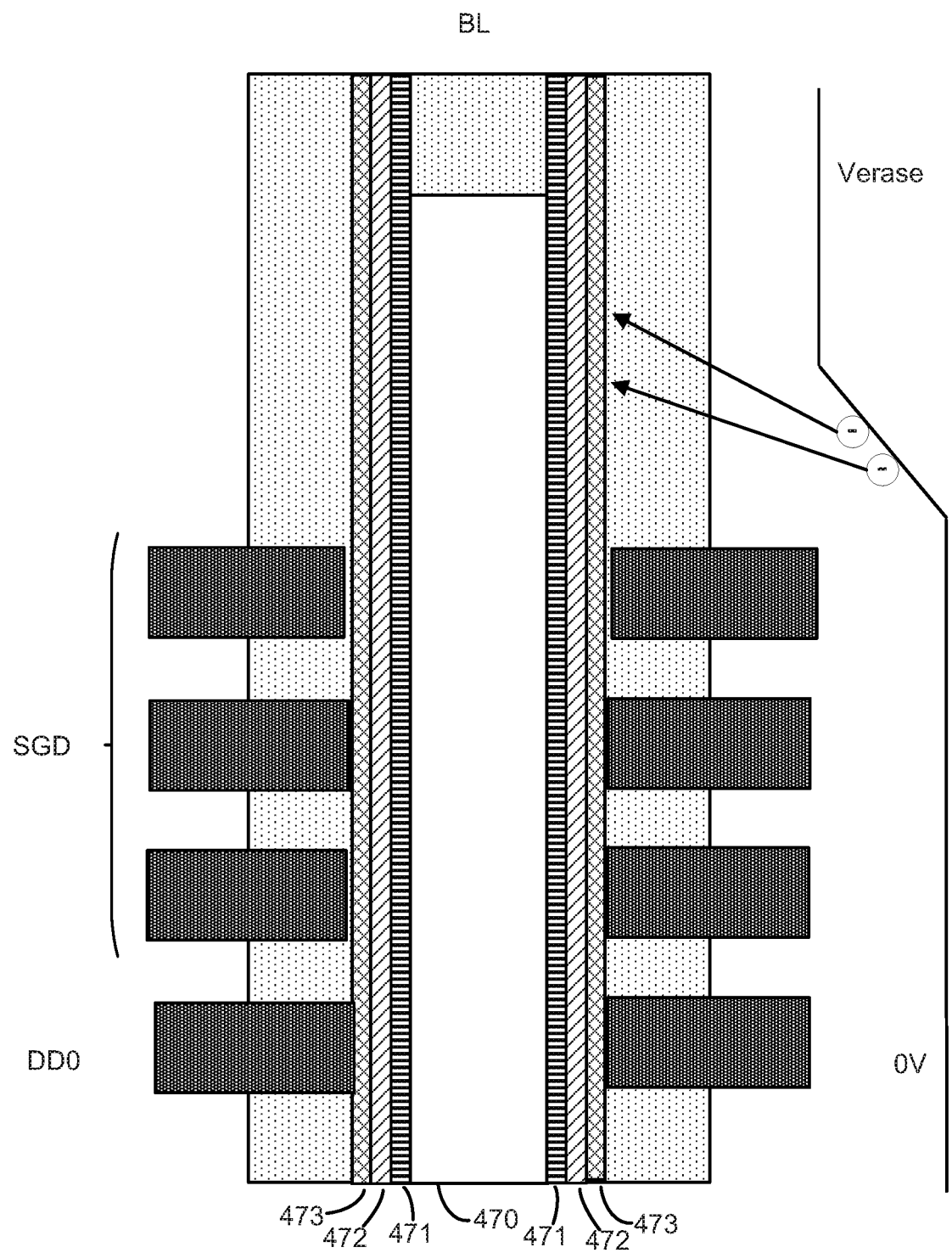
FIG. 9 schematically illustrates the channel potential at an early phase of an erase process at an upper portion of a NAND string.

Considering the example of charge accumulating in the charge trapping layer above the top-most select gate along a bit line of a 3D memory, this results in a drain side select gate (SGD) upper tail disturb which results in the string becoming resistive and causing complications with erase verify and read operations. The disturb can be caused during the erase operation due to a period of time when a difference in bias between the bit line and the memory hole can lead to electron injection into the charge trapping layer between the SGD and bit line. This area of the memory hole becomes difficult to turn on during verify and read operations due to the location of the trapped charge, where the drain side select gates SGD can only provide a fringing control field. As the number of erase/program cycles increase, the SGD disturb becomes worse, hence this problem is most likely seen in more highly cycled blocks. For example, in a memory system using blocks of both binary, or single level, memory cells (SLC) and multilevel memory cells (MLC), and where the SLC cells are more heavily cycled, this problem can occur sooner in the SLC blocks, but for higher endurance devices this problem could manifest in MLC blocks as well. FIG. 9 illustrates a model this phenomenon.

FIG. 9 schematically illustrates the channel potential at an early phase of an erase process at an upper portion of a NAND string in a 3D memory structure similarly to the cross-section of FIG. 4E. As in FIGS. 4C and 4E, a poly-silicon channel 471 is surrounded by tunneling dielectric 472 and the charge trapping layer 473. The bit line 415 attaches to the channel 471 at top. Three select gates are shown at SGD and top-most dummy word line DD0. During one embodiment of an erase operation, the word lines are biased at a low, erase enable voltage (such as in the 0-1V range), while dummy word lines and the select gate control lines are left to float and will initially be low. The channel is then ramped to the Verase voltage.

At the right, FIG. 9 represents the potential along top region of the channel at an early phase of an erase operation. Along the word lines (only DD0 is shown) and drain side select gates, the channel is at or near 0V, while in the channel region above SGD0 the channel is at Verase. This voltage differential can lead to electrons being injected into this region of the charge trapping layer 473, as also schematically represented along the right in FIG. 9. The more quickly that the erase voltage is ramped up, the more likely it is that such injection of electrons will occur.

Fresh select gate devices will have a relatively tight distribution of threshold voltages, where the distribution has a peak at around 4V, say, with a fairly compact upper tail. After cycling, the charge build-up above the select gate will give the distribution a large tail of high threshold voltage select gates that will make it difficult or impossible to turn on the corresponding drain side select gate due to excessive trapped charge, effectively cutting off the NAND string, where the faster the Verase ramp rate, the more pronounced the tail. This effect is not due to charge under the control gate of the SGD device itself, but due to the adjacent (but not controllable) channel region. As this region is not under a gate, it can also not be biased to be erased and the NAND string will continue to have an increased residual resistance as the NAND string is subject to further program/erase cycles. This sort of reduced performance, whether from the SGD disturb described with respect to FIG. 9 or due to other mechanism, can have system implications. Although the following is described primarily in the context of a NAND string and where the residual resistance is due to charge build up between the top select gate and the bit line, it can also occur when the charge builds up in other regions of the NAND string. More generally, it may also occur in other contexts where the reading of a selected memory cell requires the biasing of other memory cells of a subset of memory cells to which the selected memory cell belongs.

This problem can be addressed through processing, such as by making the memory hole structure more uniform and reducing the amount of charge trapping layer between the top select gate and bit line, or by trimming of device parameters, but such approaches may only partially treat this problem. Screening of new devices can also be used, but this does not account for device behavior once it is in subsequent operation.

Figure 10:
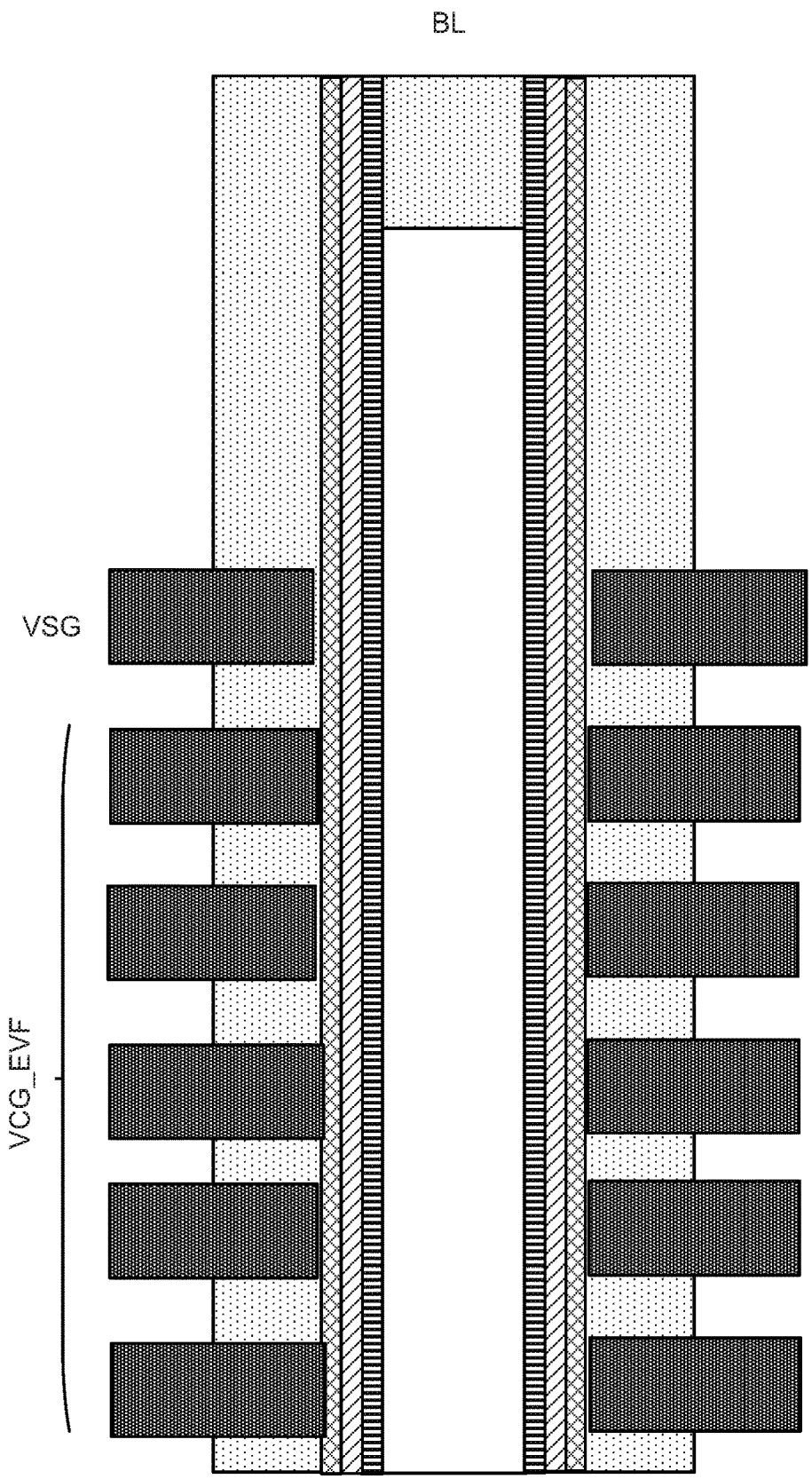
FIG. 10 illustrates a NAND string biased for an erase verification operation.

FIG. 10 illustrates a NAND string biased for an erase verification operation. In an erase verification, to check whether all data storing memory cells are erased, the word lines are put an erase verify voltage VCG_EVF, such as 0V, such that these will only conduct if in the erased state. The select gates and any dummy memory cells by are biased to be on by respective voltages VSG and VCG_READ. (An embodiment with only a single drain side select gate is shown to simplify the figures.) When so biased, an erased NAND string should conduct. However, if there is sufficient residual resistance due to un-erasable trapped charge, this will lead to the NAND string failing an erase verify even when all data content is erased unless the read values are rectified to account for the reduced performance this residual resistance can cause.

FIG. 11 illustrates an example of erase verify results when several NAND strings fail to verify as erased. In the table of FIG. 11, the top row lists data latch addresses for N+1 data latches, each data latch corresponding to a column of 8 NAND strings in this embodiment. The second row shows the data latch values expected for an erase verify in which all NAND strings have been successfully erase, showing all 1 s for NAND string of each column's data latch. The bottom line shows the data latch values actually seen in an example where the 8th, 5th, 1st and 3rd NAND strings of respective columns 1, 3, (N−3) and N fail to verify, even though erased, as represented by the latched value of "0".

Through use of error correction codes (ECC) and other techniques, memory systems are generally structured to tolerate a certain amount of error. Consequently, the NAND strings with residual resistance and consequence reduced performance can be dealt with during an erase verify operation by allocating a larger bit ignore parameter to account for the number of cutoff strings due to SGD disturb increases as erase/program cycles increase. This would allow higher endurance and prevent excessive erase failures and grown bad blocks. However, this can only cover so many such disturbs and will also have other implications to system though erase page detection, ECC operation, and other problems.

The residual resistance will also affect read operations in these cutoff NAND strings. This can be illustrated with respect to FIG. 12A, which again shows the same portion of a NAND string as in FIG. 10, but biased for a read operation. In a read operation, the drain side select gate is turned on by being biased to a level VSG. The non-selected memory cells are biased by a level VCG_READ that will turn on the memory cell for any of the data states that it may be programmed to. As all of the NAND string is otherwise turned on, the conductivity of the NAND string should depend upon the threshold voltage of the selected memory cell and the level of the read voltage VCGR applied to the selected memory cell's word line. As illustrated with respect to FIG. 5, taking VCGR=$Vr_i$ allows for determination of whether a memory cell is in the state $S_i$ or above. However, FIG. 5 represents a somewhat idealized representation of the distribution of threshold voltages for the memory cells, as in practice the states may not be so well defined by a program operation; and even if initially well-defined, these distributions will tend to spread over time.

Figure 12A:
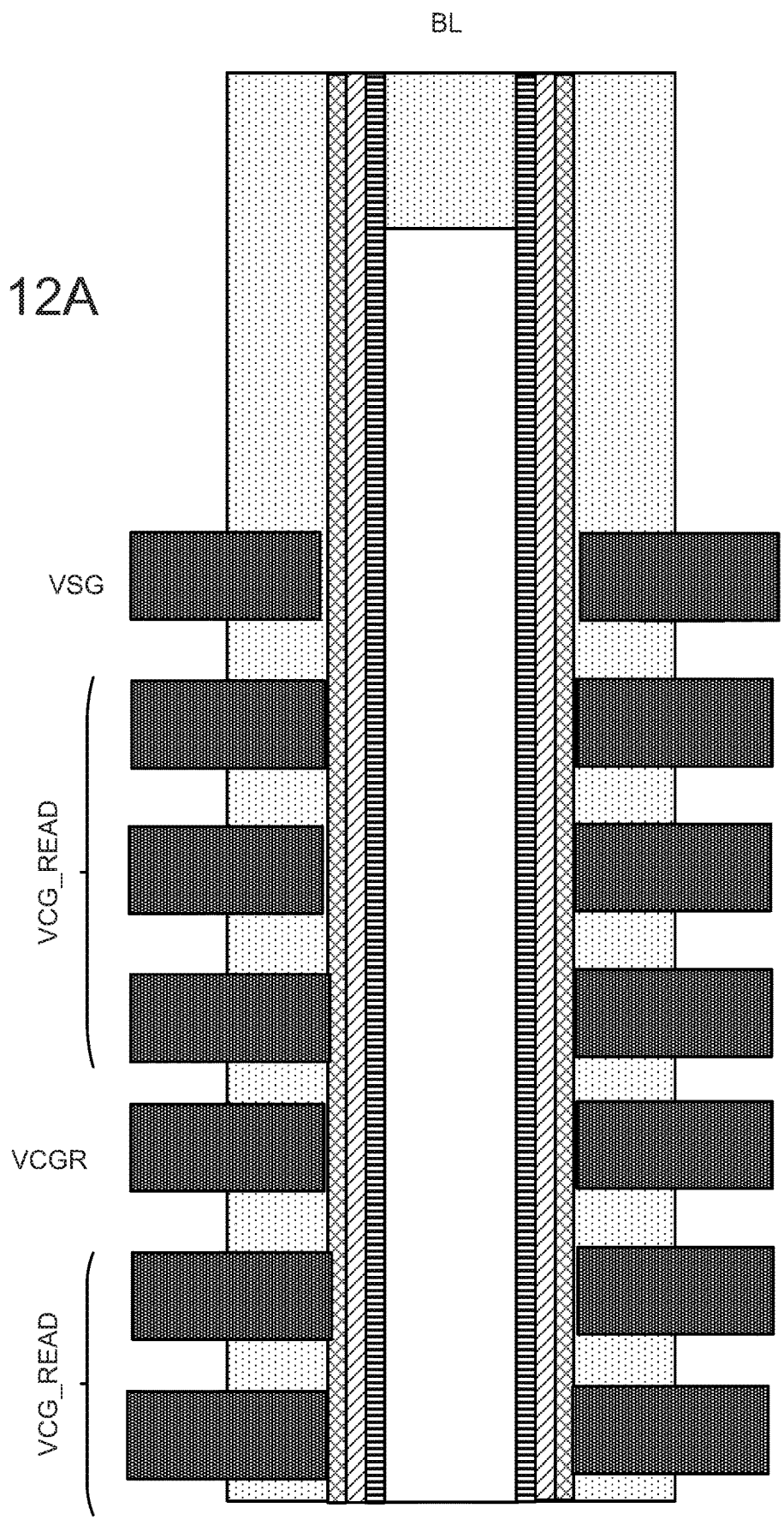
FIG. 12A shows the same portion of a NAND string as in FIG. 10 biased for a read operation.
Figures 12B, 14:
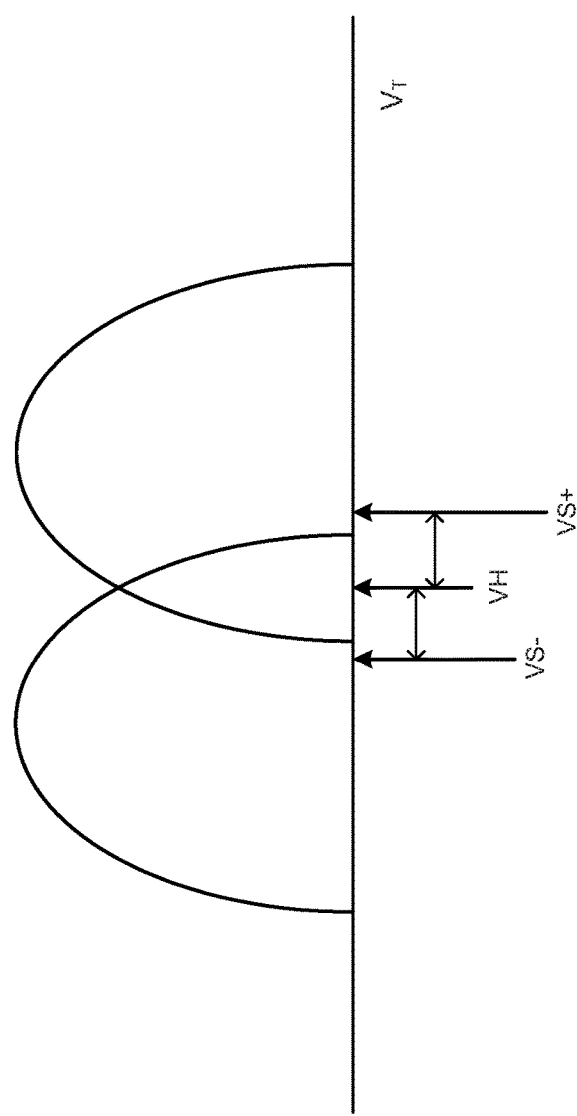
FIG. 12B illustrates the overlap of the distribution of two adjacent data states and a set of read values that can be used to determine the data state of a cell and the reliability of such a read.
FIG. 14 is a table illustrating the different read results and their consequences for NAND strings suffering from residual resistance.

FIG. 12B illustrates the overlap of the distribution of two adjacent data states and a set of read values that can be used to determine the data state of a cell and the reliability of such a read. The read value VH is an initial data state value, or "hard read", value used to determine a "hard bit" (HB) value and corresponds to the values $Vr_i$ of FIG. 5 used to differentiate the different states if they were well defined, separated distributions as in FIG. 5. The additional read levels of VS+, margined somewhat above VH, and VS−, margined somewhat below VH are "soft read" values and can be used to provide "soft bit" (SB) values. The soft bit values give information on the quality or reliability of the initial data state value, or hard bit, data, as the soft bit data provide information on the degree to which the distributions have spread. Some embodiments of ECC codes, such as low density parity codes (LDPC), can use both the hard bit and the soft bit data in order to increase their capability. Although FIG. 12B shows only the pair of soft bit read values, other embodiment can use additional margined read valued to generate more soft bit values for a given hard bit if higher resolution is desired. More generally, the hard bit corresponds to the presumed data value based on a sensing operation and the soft information, which can be a single binary soft bit, multiple soft bits or a decimal/fractional value, indicates the reliability or trustworthiness of the hard bit value. When used in ECC methods that use soft information, the soft information can be treated as the probability that a corresponding hard bit value is correct. When a NAND string suffers from residual resistance, it will affect both the hard and soft bit values by effectively making a selected memory cell appear to be non-conductive, corresponding to a higher data state, even if its control gate voltage is sufficient to turn on the memory cell. Consequently, a sensing operation will result in a "0" (non-conducting) value whether or not it has a threshold value above or below a read point.

Looking at FIG. 12B, during a read operation these cutoff strings read data value (HB) will be non-conducting and read as "0", whether the memory cell's true threshold value lies to the left or the right of VH. This behavior can be detrimental to LDPC or other ECC codes that use soft bit information since the soft bit (SB) information, indicating the reliability of the HB data, for the soft bit values of these cutoff strings will be thrown off as well unless rectified.

If a memory cell is within the central region of either distribution of FIG. 12B, a read at VS+ and VS− will provide the same result; if these reads differ, it means the memory cell's threshold voltage is between these values and could be from the tail region of either the distribution above or the distribution below, so that the HB data is unreliable. By reading at both these levels and XNOR-ing the results, this give an SB value of "1" if the data is deemed reliable and an SB value of "0" if unreliable.

In the case of a NAND string with residual resistance, both the SB+ and SB− read will also be "0", independent of the memory cell's true threshold. As:

$$SB = (SB+) XNOR (SB-)$$
$$= \text{``0''} XNOR \text{``0''}$$
$$= 1,$$

SB=1 and the HB read value will be treated as reliable. During a soft bit decode in ECC, this will result in a programmed "0" having HB="0" and SB="1", indicating a reliable correct bit (RCB); and a programmed "1" having HB="0" and SB="1", which a hard error (HE). ECC codes, such as LDPC, have correction capabilities that are very sensitive to hard error rates and suffer reduced correction capability as hard errors increase.

FIG. 12C is a table illustrating the different read results and their consequences for NAND strings suffering from residual resistance. Similar to FIG. 11, the top row shows the data latch addresses for columns of a memory array, followed in the second row by the expected data values if there were no residual resistance. Only the values for the NAND strings with residual resistance are shown, with the others having values represented by an "x". In this example, the 8th NAND string of column 1, 1st NAND string of column (N−3) and 3rd NAND string of column N all suffer from residual resistance and are expected to have a HB read value of "1", but, as shown in the third line, have a measure read value of "0". The 5th NAND string of column 3 also has residual resistance and has a measured HB value of "0", except that in this case this is also the correct, expected value. The system can determine the correct values if the amount of error in the corresponding ECC codewords do not exceed the ECC's capabilities.

The next two lines of FIG. 12C show the measured SB+ and SB− read values that, for each of the NAND strings in question, return a "0", which in turn provide an SB value of "1" for all of the NAND string with residual resistance. The bottom line shows the result of these values as seen by the memory system: For the 8th NAND string of column 1, 1st NAND string of column (N−3) and 3rd NAND string of column N, these all have a "hard error" (HE), where the hard bit value is wrong, but the soft bit value indicates that it is reliable; and for the 5th NAND string of column 3 is a reliable correct bit (RCB), as the measured data is correct and the measured SB indicates that the result is reliable, although it is not. Although ECC may still be able to extract the correct values if the corresponding codewords do not have too much error, these errors due to residual resistance may result in an amount of error beyond the system's ability.

As described with respect to FIG. 11, allowing for a larger bit ignore parameter can help with the erase verify process, but would work against handling the residual resistance disturb through ECC in the read process. A higher bit ignore parameter value for erase would reduce erase failure due to drain side select gate disturb disturb, which enables higher endurance memory; but the higher bit ignore value can result in degraded correction capability due to the increased number of hard errors limiting endurance and reliability.

To deal with this problem, during the generation of soft information the memory can identify the NAND strings with reduced performance due to the residual resistance within a block and set the soft bit information for these cut off NAND strings to unreliable (e.g. set SB value from "1"→"0"). This can help to rectify the read results and will reduce the hard error rate due to drain side select gate or other residual resistance types of disturbs. These techniques can be implemented within the memory device, at the system level using the controller, or some combination of these through various combinations of hardware, firmware, and software, depending on the embodiment. As used herein, a NAND string with reduced performance refers to a change in an operational characteristic of the NAND string from an acceptable level or range to an unacceptable or undesirable level or range. Examples of changes to a characteristic of NAND strings that impacts performance include, but are not limited to, a build up of amounts charge in regions of the charge trapping material or other dielectric in the NAND structure, and the like. Depending on the location and amount of trapped change, standard biasing conditions available for operating the NAND string are unable to fully turn "on", or activate, the NAND string and are also unable to remove the unwanted trapped change through an erase process or other remediation. In certain embodiments, a NAND string with reduced performance refers a NAND string that fails to respond when a storage operation is performed on the NAND string. This effect can be seen in sensing operations, whether for a program verify, a data read, or scanning operations such as an erase verify or the "read verify" described below.

NAND strings with residual resistance can be detected by a process similar to an erase verify operation. As illustrated in FIG. 10, in an erase verify select gates and any dummy word lines are biased to be on, while the data memory cells are biased to be on only if they are in an erased state. FIG. 13A illustrates a portion of a NAND string biased for an additional read or scanning process, or "read verify" operation, to determine whether the NAND string has any residual resistance. Although only a single NAND string is shown, as with an erase verify operation, this scanning process can be performed at the block level (for all of the NAND strings of the block). The select gates are turned on by applying the voltage VSG. The memory cells of the NAND string are biased by the word line drivers with a read verify voltage (VCG_RVY) that is at a high enough level to turn on all of the memory cells of the NAND string, independently of their stored data state, such as illustrated with respect to FIG. 5. Depending on the embodiment, the VCG_RVY can be the same as the VCG_READ used for non-selected word lines in a standard read operation or a separate level introduced for the scan of the read verify process. Once all of the devices in the NAND string are biased by the corresponding drivers, a sensing operation is performed. The NAND strings with a drain side select disturb or residual resistance from another mechanism will be read as "0", whereas all normal strings will be read as "1". This is a consequence of the reduced performance of the NAND string, since although biased to be conducting, the NAND string has enough residual resistance to return the reference value of "0".

Figure 13A:
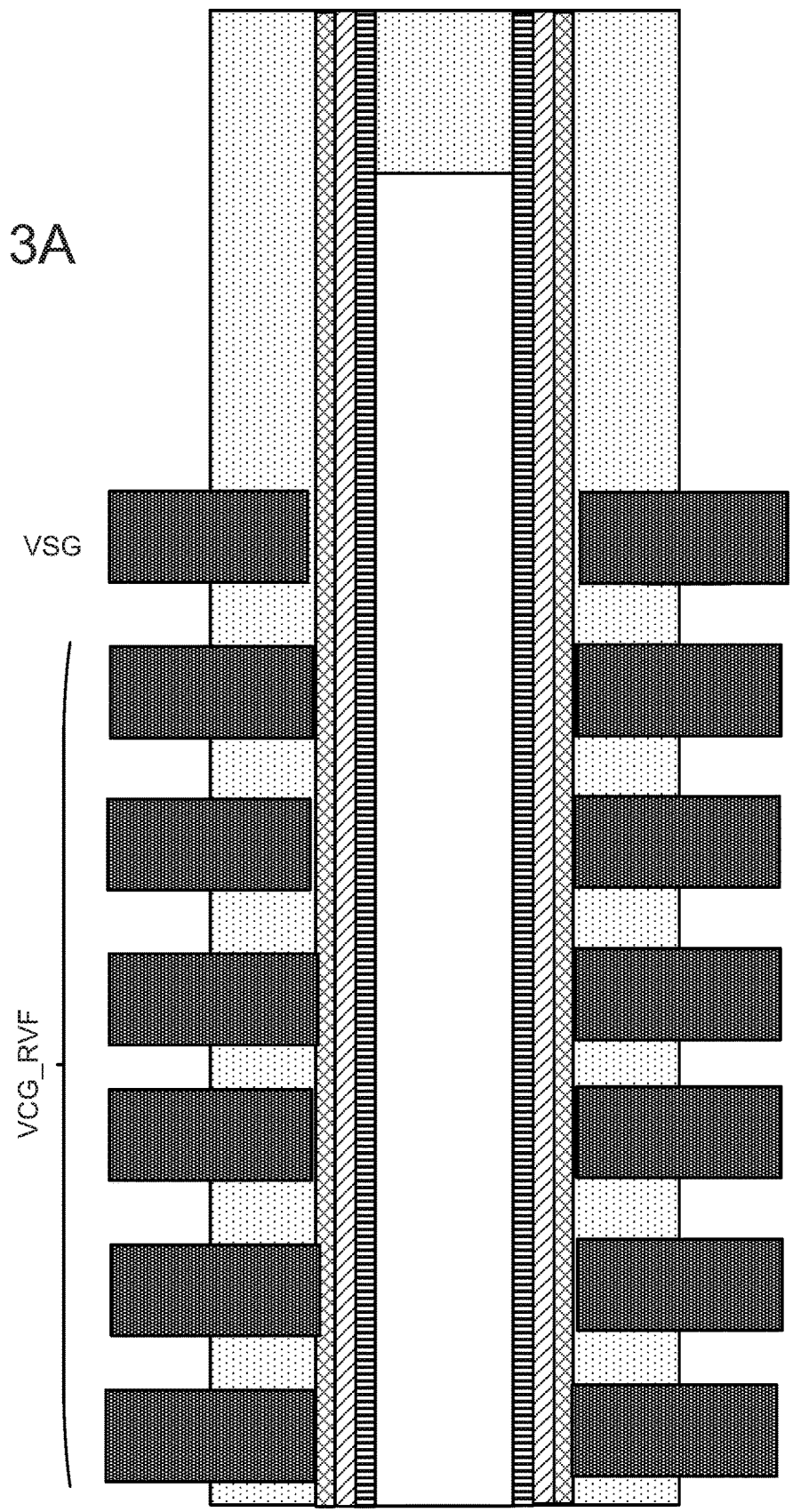
FIG. 13A illustrates a portion of a NAND string biased for a "read verify" scanning operation to determine whether the NAND string has any residual resistance.

The embodiment of FIG. 13A biases the select gates to VSG, with the memory cells biased to VCG_RVF. In alternate embodiments, the select gates (the drain side select gate, the source side select gate, or both) can also be biased to VCG_RVF. Depending the amount and location of the trapped charge, the VCG_RVF may, to some degree, turn on (e.g. activate) a select gate that does not conduct at the lower VSG level. This can indicate a NAND string with moderately reduced performance that may be marginal, but still be useable. In other embodiments, biasing the drain side select gate at VCG_RVF, while some or all of the memory cells and the other select gate are at VCG_RVF or a lower level, can be used to determine the location of the charge build up causing the residual resistance leading to reduced performance of the NAND string. The determination of trapped charge in other locations of the NAND string can similarly be determined by biasing one more memory cells or select gates at a location to VCG_RVY, while the other transistors are at a lower voltage.

The residual resistance of the NAND string reduces performance of the NAND sting because the actual conduction state of the NAND string will not correspond to level at which the control lines (the word lines and select lines) are biased. An indication of this is that the NAND string will have a reduced level of conduction, or no conduction at all, when a selected memory cell is biased at the read voltage corresponding to its data state and the non-selected memory cells and select gates are biased to be on. More generally, an indication of reduced performance for a set of memory can manifest itself when the set of memory cells, or a subset of the cells, does not conduct at the level that would be expected for a set of bias conditions in a typical set of such cells under normal operation.

Figures 13B, 15:
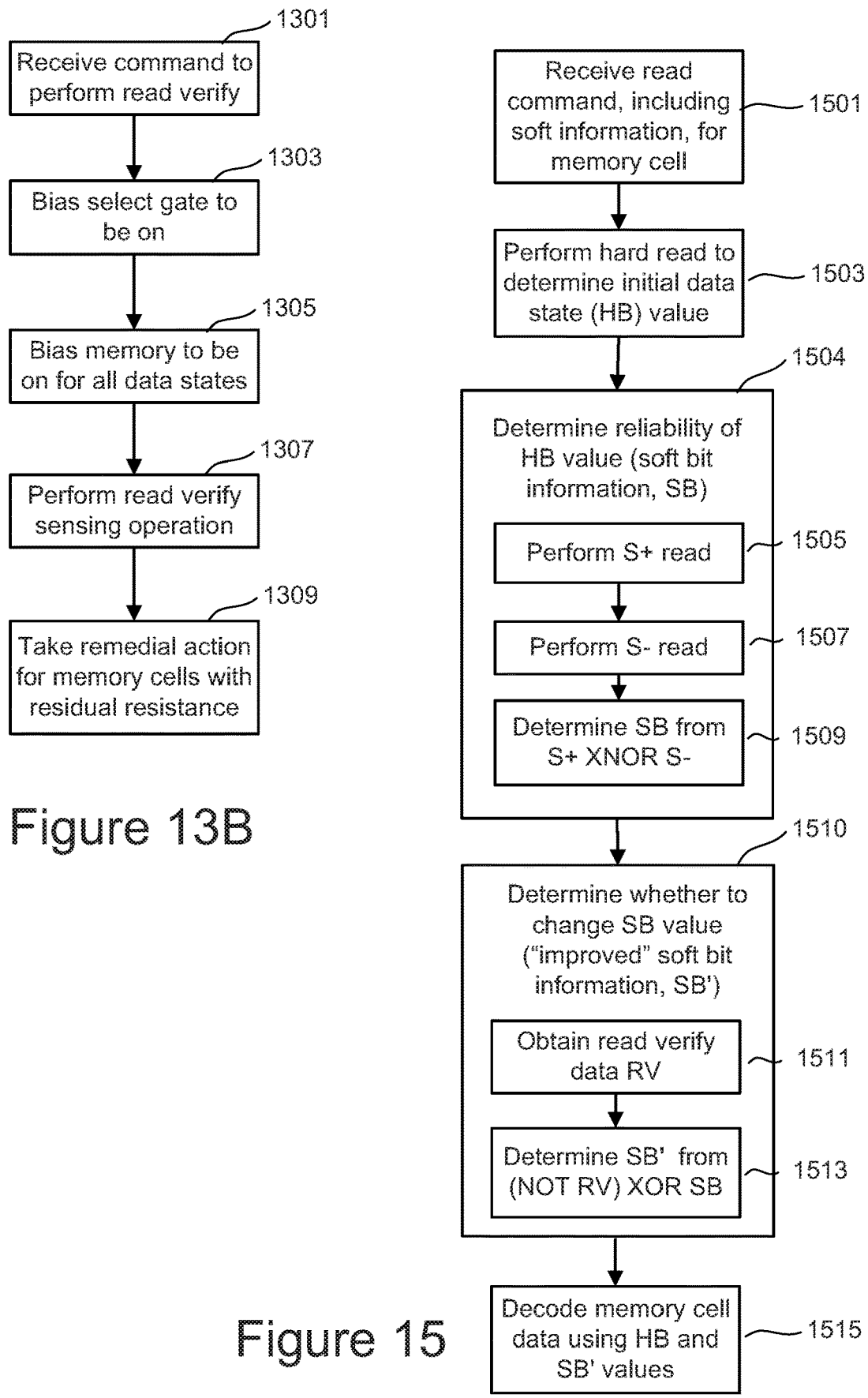
FIG. 13B is a flowchart describing one embodiment of a read verify process for a NAND string using bias levels as shown in FIG. 13A.
FIG. 15 is a flowchart describing one embodiment of a read process that determines improved soft bit information for a NAND string.

FIG. 13B is a flowchart describing one embodiment of a read verify process for a NAND string using bias levels as shown in FIG. 13A. Beginning at step 1301, the memory receives a command to perform a read verify operation. Depending on the embodiment, the read verify operation can be performed at a number of different times; and a single embodiment may use combinations of these variations. For example, the read verify can be part of another command, such as a read command that includes generating hard bit, soft bit, and read verify information. The command may also be for soft information, where this can include both soft bits and a read verify results. Such a soft information request may be due to an ECC decoding failure based only on hard bit information, it which case the ECC module may request soft information. Although the addition of the read verify operation can lead to lowering of performance, a soft bit read is typically not required and considered outside of the normal operation performance path, so that the impact of the read verify scan will generally be small.

In still other embodiments, a read verify scan can alternately, or additionally, be in response to an independent command. For an independent command, this can, for example, be for the purposes of assembling an inventory of NAND strings with residual resistance for later use or to modify previously obtained soft information. Depending on the embodiment, this inventory can be maintained by the controller, on the memory die itself in a table, or other repository. The read verify scan can be performed at device test time, when the device is fresh (before being used for the first time), and/or after the device has been in operation for some time, such as based on a program/erase count (or other wear based parameter) or in response to an error result. In some embodiments, the read verify scan that assembles the inventory can be performed as part of a Built In Self-Test (BIST) operation. In some embodiments, the read verify scan can be performed in response to a specific command issued after a soft bit read to rectify the previously obtained soft values in case of an ECC decode failure.

At step 1303, the select gates are biased with the voltage VSG that should be sufficient to turn the select gates of a normally functioning NAND string. At step 1305, the memory cells are biased with VCG_RVY and should also be conducting independent of their stored data states. Both user data memory cells and dummy memory cells can be biased with the same level, but other embodiments can use a different level for the dummy memory cells. Although shown as separate steps, step 1303 and 1305 can be performed concurrently; and although discussed in terms of a single NAND string, the additional read verify operation can be performed at the block or other multi-string level.

Once the NAND string is biased, the read verify process is performed at step 1307. A normal string with normal performance, without a high level of residual resistance, will conduct and be read as a "1". In this embodiment, the result of the read verify operation serves as an indication of normal performance or of reduced performance due to lack of NAND string conductance. As used herein, an indication comprises a flag, a metadata value, a data value, a result of a test operation, a test of a storage sub-operation, such as a read verify process, or the like. The indications can be maintained by the controller, on the memory device itself, or some combination of these. Those of skill in the art will recognize that the indication that a NAND string has reduced performance may be determined dynamically as part of performing a storage operation such as a read operation, a program operation, an erase operation, or the like. In other embodiments, or in addition, one or more indications in relation to one or more NAND strings may be determined or set as part of a diagnostic, testing, or evaluation procedure performed after certain operating conditions have been satisfied. For example, determination of such indications may be done after a predetermined number of program and erase cycles for one or more erase blocks that include the NAND string or in response to ECC results.

If the string has a residual resistance above some reference value level, and consequently does not register as conducting when biased for read verify operation, it will be read as a "0", indicating reduced performance and remedial action can be taken for such cut off NAND strings at step 1309. The remedial actions can include just adding the cut off NAND string to a table or other repository giving an inventory of such strings; using the information as part of determining soft information for the NAND string, as described in the following, for mapping out the NAND string as defective; or some combination of these.

Once the NAND strings with reduced performance due to large amounts of residual resistance are identified, the system or NAND chip can use this information downgrade the soft bit data to indicate a lower reliability of the hard bit data. In one set of embodiments, it can convert hard errors (HE) to soft errors (SE), and reliable correct bits (RCB) to unreliable correct bits (UCB). Error correction codes such as LDPC are less tolerant to HE, SE, and UCB in that order. This is illustrated in the table of FIG. 14.

FIG. 14 is a table illustrating the different read results and their consequences for NAND strings suffering from residual resistance and repeats much of FIG. 12C, but also includes the result of a read verify and soft bit data that reflects the read verify data's effect on the soft bit data. More specifically, FIG. 14 repeats the data latch address, expected and measured HB bit, measured SB+ and SB− bits, and SB values from FIG. 12C. Next is the read verify value for all of the NAND strings. For NAND strings with reduced performance due to excess residual resistance, the read verify result is "0", whereas for the other NAND strings (taken to be normal in this example) the result is "1". For the NAND strings with a read verify value of "0", the SB value is then rectified by being downgraded from a reliable value of SB=1 to an unreliable "improved soft bit" value SB' of SB'=0, while for the NAND strings with a read verify of "1" SB'=SB.

The conversion of the soft bit value SB to the improved soft bit value SB' can be effected within the data latches associated with the NAND strings, such as those illustrated in FIG. 1C. During a soft read process, the soft bit value SB is determined from XNOR-ing the S+ and S− and stored in a data latch, say DL1. An additional read is then performed and the read verify value RV stored in another data latch, say DL2, for each NAND string. The value for DL2 is then inverted (NOT DL2), after which DL1 is XOR-ed with DL2 to form SB', which can then be stored in DL3. Consequently, $$SB'=(SB)XOR(NOT\ RV),$$

where (NOT RV) is the invented read verify value. The SB' value can then supplied to the ECC engine from the DL3 latch.

FIG. 15 is a flowchart describing one embodiment of a read process that determines the improved soft bit information for a NAND string that can be used to rectify the read values. At step 1501 the memory device receives a read command for hard and soft information from a memory cell, with the initial data value, or hard bit, read to determine the data state (HB value) performed at step 1503. The read for the hard bit data can be based on the read values $Vr_i$ for the state $S_i$ as described above with respect to FIG. 5 and further described with respect to FIG. 12B.

At step 1504 the soft bit value SB indicating the reliability of the HB value is performed. The soft bit reads for S+ and S− are respectively performed at sub-steps 1505 and 1507, where these read values are respectively margined above and below the hard bit read values, as is also described above with respect to FIG. 12B. Although shown in the order of steps 1503, 1505, and 1507, different embodiments can perform these three reads in any convenient order. The SB values are then determined from the S+ and S− values at step 1509 by XNOR-ing the S+ and S− values. This can be effected in the latches associated with the NAND string.

Step 1510 is a rectification process for the other read values and determines whether to change the soft bit data SB based on the additional read data for the NAND string form the read verify process. At step 1511 the read verify data for the NAND string is obtained, such as described with respect to the read verify process in the flow of FIG. 13B. Depending on the embodiment, the additional read operation can be performed as part of the same read command as the hard read, soft reads, or both; it can be based on information from a previously performed read verify and, for example, be obtained from a table or other repository of NAND strings suffering from excessive residual resistance; or it can be obtained as part of a later operation and used to update the SB value from step 1509. For example, in response to the ECC module failing to decode using just the hard bit data (or the hard bit and "un-improved" soft bit data), a read verify scan can be performed. The improved soft bit value SB' is then determined from the SB and read verify values at step 1513, either being the same as the SB value or being changed to a downgraded value. As described above, this process can be performed in an on-chip process under control of a state machine (112, FIG. 1) and/or other logic in an on-chip microcontroller (110). If these values are still in or available to the data latches, the value for SB' can be determined in the data latches as described above. In other embodiments, it can be determined later if, for example, an ECC decoding fails and the SB' values are then obtained to incorporate soft information for a further decoding attempt. Once the hard bit values HB and the improved soft bit information SB' are obtained, the data from the memory cell can be decoded at step 1515.

The read verify operation and determination of the improved soft data value can be done according to a number of complimentary embodiments. For example, in some embodiments they can be built into a soft bit read command and completely executed on the memory chip to make the process transparent to system. This would reduce performance of soft bit read as an extra read is used, but since soft bit read is an operation that is typically outside of the performance path, the effect on performance should usually be acceptable. In other embodiments, the system could use a read verify command/operation to identify the cutoff strings with excessive residual resistance and via controller modify soft bit information. In still other embodiments, the system could also use a read verify operation to periodically build a table of the addresses of cutoff NAND strings to modify soft information on controller. By reducing the number of hard errors via the read verify operation, the system can recover some of the lost ECC capability of LDPC or other codes that use soft information, allowing the system more tolerance (such a higher bit ignore parameter) for residual resistance disturbs and hence higher endurance.

Figure 16:
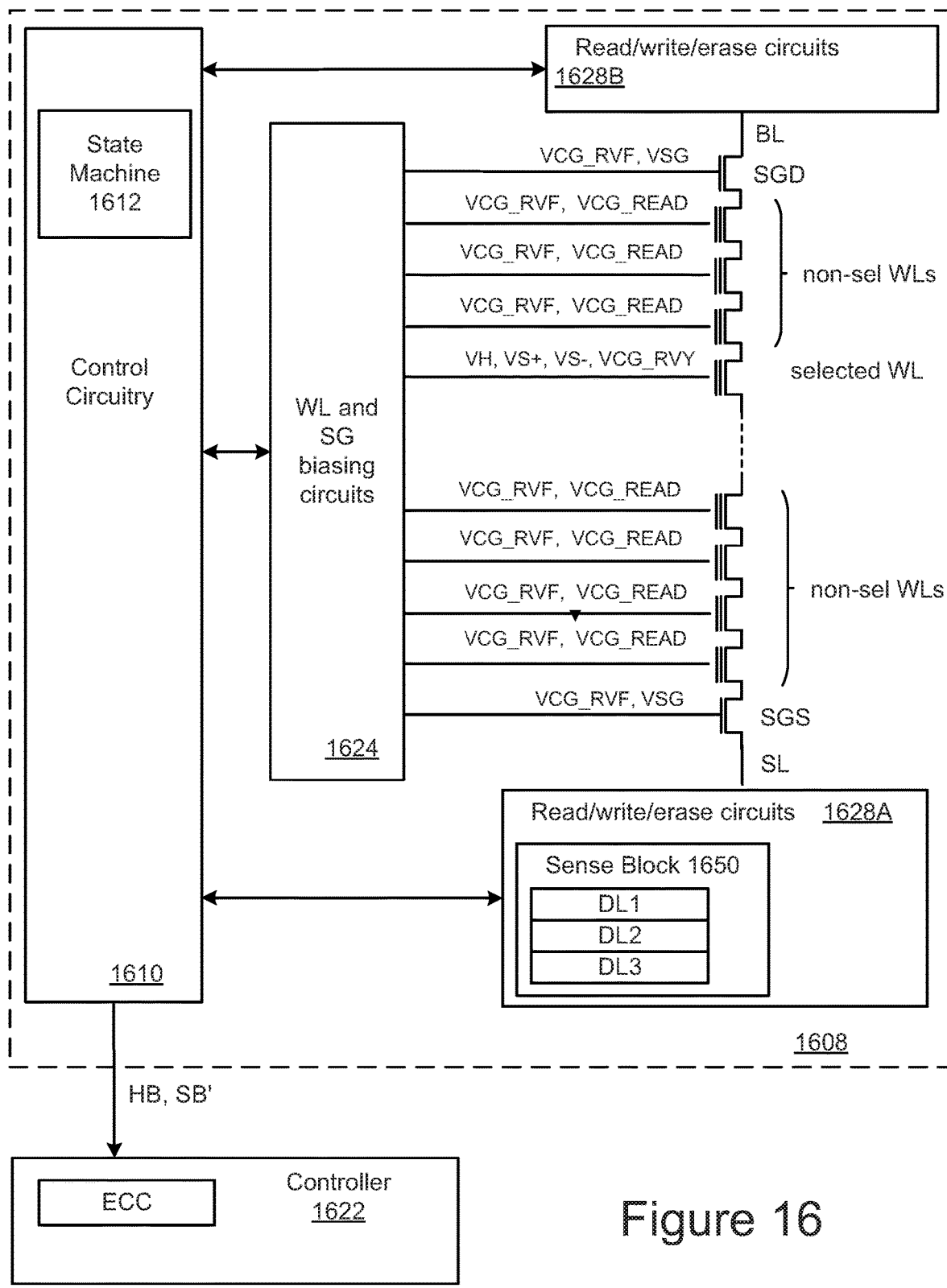
FIG. 16 illustrates some memory circuit elements that are relevant to the read verify operation and the determination of the improved soft information.

FIG. 16 repeats in a simplified form a number of the elements of FIGS. 1-4F that are relevant to the discussion of the read verify operation and the determination of the improved soft information for one set of embodiments. A memory circuit 1608 includes a NAND string, which includes a number of memory cells connected in series between a bit line BL and a source line SL, which are in turn each connected to read circuits 1628A and 1628B at either end. A sense block 1650, including a set of data latches, for the NAND string is shown as being in the lower read circuits 1628A, although these can be located in either or both of the read circuits 1628A and 1628B, depending on the embodiment. An element of the read circuits includes the word and select line biasing circuit 1624, which can include the drivers for the control lines (word lines and select gate lines). The biasing circuit 1624 applies the various voltage levels described with respect to the flows of FIGS. 13B and 15, including: the select gate voltages VSG; the read verify voltages VCG_RVF applied to all word lines in the read verify operation; and the different read voltage levels applied to the selected word line (VH, VS+, VS−) and non-selected word lines (VCG_READ) in the different read operations. These levels allow for the hard bit, soft bit and read verify operations to be performed by the control circuit 1610, which can include that state machine 1612, with the read values being latched in the sense block 1650 where the can be used to store the hard bit values as well as the soft information. The hard bit value HB and "improved soft bit" value SB' can then be supplied to ECC elements for decoding, where the ECC block can be included on a separate controller circuit 1622.

In some embodiments, an apparatus includes a plurality of non-volatile memory cells, including a subset of memory cells. Control line drivers are connected to the plurality of memory cells, where the control line drivers configured to bias the memory cells for sensing operations. A sensing circuit is connected to the plurality of memory cells, the sensing circuit determines a hard bit value for a selected memory cell of the subset and a soft bit value for the selected memory cell. A control circuit is configured to change the soft bit value in response to an indication that the subset of memory cells has a reduced performance level.

In some embodiments, an apparatus includes a NAND string having a plurality of non-volatile memory cells connected in series between one or more first select gates and one or more second select gates. A biasing circuit is connected to the memory cells and select gates of the NAND string. A read circuit is connected to the biasing circuit and to the NAND string. The read circuit is configured to bias the memory cells and the select gates of the NAND string to a conducting state independent of a programming level of the memory cells and to rectify a result of a read operation for a selected memory cell of the NAND string in response to determining that the resistance in the NAND string satisfies a reference threshold.

Further embodiments of a non-volatile memory system include a non-volatile memory chip and an error correcting circuit. The non-volatile memory chip includes a NAND string having a plurality of non-volatile memory cells and a read circuit connected to the memory cells of the NAND string. An on-chip control circuit is connected to the read circuit and configured to perform sensing operations on the memory cells of the NAND string. A sensing operation for a selected memory cell of the NAND string including a first read operation to determine a hard bit value for the selected memory cell and a second read operation to determine a soft bit value for the selected memory, wherein the on-chip control circuit is configured to modify the soft bit value in response to an indication that the NAND string has a reduced performance level. The error correcting circuit configured to perform a decoding operation using the hard bit value and the modified soft bit value received from the on-chip control circuit.

Other embodiments include a non-volatile memory device having a NAND string of non-volatile memory cells and means connected to the NAND string for biasing the NAND string for a sensing operation. Control means are connected to the NAND string and to the means for biasing the NAND string for a sensing operation, and configured to perform a sensing operation on the NAND string to determine whether an amount of residual resistance in the NAND string is above a reference level when the memory cells of the NAND string are in a conducting state.

In examples implementations, the NAND string can be part of a monolithic three dimensional memory structure as described above with respect to FIGS. 3 and 4A-4F, where a plurality of dielectric layers, a plurality of memory columns and plurality of isolation areas, the word line layers are arranged alternatingly with the plurality of dielectric layers forming a stack, the memory columns extend vertically through at least a portion of the stack.

The control means can include the controller (122, FIGS. 1A and 2), the on-chip control circuitry 110 (including the state machine 112 or other logic in the on-chip controller), or some combination of these and be implemented through hardware, firmware, software, or some combination of these. The means for biasing the NAND string for a sensing operation can include the read/write/erase circuits 128, decoding circuitry 124, power control 116 and can include the various switching and decoding circuitry, voltage supplies and regulator circuits, and charge pumps used to bias the array and apply the erase voltage. Examples of the control means is also represented at element 1610, which can include state machine 1612, of FIG. 16 and the read means can include elements 1628A and 1628B, along with the elements for biasing the word lines at element 1624.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of zero or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a plurality of non-volatile memory cells, including a subset of memory cells;
   control line drivers connected to the plurality of memory cells, the control line drivers configured to bias the memory cells for sensing operations;
   a sensing circuit connected to the plurality of memory cells, the sensing circuit configured to determine a hard bit value for a selected memory cell of the subset and to determine a soft bit value for the selected memory cell; and
   a control circuit configured to change the soft bit value in response to an indication that the subset of memory cells has residual resistance greater than a reference value.

2. The apparatus of claim 1, wherein the sensing circuit determines whether the subset of memory cells has a residual resistance greater than the reference value when the control line drivers bias the memory cells of the subset to transition to a conducting state.

3. The apparatus of claim 1, wherein the subset of memory cells is a NAND string of memory cells connected in series between one or more first select gates and one or more second select gates.

4. The apparatus of claim 3, the sensing circuit comprising:
   a sense block configured to perform a scan to determine the indication that the subset of memory cells has a residual resistance greater than the reference value, the scan including the control line drivers biasing the memory cells of the NAND string to be in an on state independently of a data state stored therein and biasing select gates of the NAND string to be in an on state, and with the select gates and memory cells of the NAND string biased to be on the sense block determines residual resistance greater than the reference value based whether the NAND string has residual resistance greater than the reference value.

5. The apparatus of claim 3, the sensing circuit comprising:
   a sense block configured to perform a scan to determine the indication that the subset of memory cells has residual resistance greater than the reference value, the scan including the control line drivers biasing a select gate of the NAND string to a higher voltage level than used in determining the hard bit value, and the sense block determines residual resistance greater than the reference value based on whether the NAND string has residual resistance greater than the reference value.

6. The apparatus of claim 1, wherein the sensing circuit determines the hard bit value by determining whether the selected memory cell has a threshold voltage above the reference value, and the sensing circuit determines the soft bit value by determining whether the selected memory cell has a threshold voltage within a range around the reference value.

7. The apparatus of claim 1, wherein the sensing circuit determines the hard bit value, the soft bit value, and the indication that the subset of memory cells has residual resistance greater than the reference value in response to a single read command.

8. The apparatus of claim 1, wherein the sensing circuit determines the indication that the subset of memory cells has residual resistance greater than the reference value in response to a command independent of a command configured to determine the hard bit value and the soft bit value.

9. The apparatus of claim 8, wherein the apparatus is configured to store the indication that the subset of memory cells has residual resistance greater than the reference value in a repository.

10. The apparatus of claim 1, wherein the control circuit and the subset of memory cells are formed on a single memory die.

11. The apparatus of claim 10, wherein the sensing circuit includes a plurality of data latches configured to store the soft bit value and change the soft bit value in response to a signal from the sensing circuit.

12. The apparatus of claim 1, wherein the apparatus includes an integrated memory circuit including the subset of memory cells and a controller circuit separate from the integrated memory circuit, wherein the controller circuit is formed on the controller circuit.

13. The apparatus of claim 1, wherein the memory cells are part of a monolithic three-dimensional semiconductor memory device where the memory cells are arranged in multiple physical levels above a substrate and comprise a charge storage medium.

14. The apparatus of claim 1, wherein:
the control circuit is configured to use the soft bit value with the hard bit value to determine a data value stored in the selected memory cell.

15. A non-volatile memory system, comprising:
a non-volatile memory die, including:
a NAND string having a plurality of non-volatile memory cells;
one or more on-die control circuits a read circuit connected to the memory cells of the NAND string, and the one or more control circuits are configured to:
perform sensing operations on the memory cells of the NAND string, a sensing operation for a selected memory cell of the NAND string includes a first read operation to determine a hard bit value for the selected memory cell and a second read operation to determine a soft bit value for the selected memory; and
modify the soft bit value in response to an indication that the NAND string has a residual resistance greater than a reference value; and
an error correcting circuit configured to perform a decoding operation using the hard bit value and the modified soft bit value received from the one or more on-die control circuits.

16. The non-volatile memory system of claim 15, wherein the one or more on-die control circuits include a state machine configured to modify the soft bit value in response to the indication that the NAND string has residual resistance greater than the reference value.

17. The non-volatile memory system of claim 15, further comprising:
a controller circuit, separate from the non-volatile memory die, that includes the error correcting circuit.

18. A non-volatile memory device, comprising:
a NAND string of non-volatile memory cells;
means, connected to the NAND string, for biasing the NAND string for sensing operations; and
control means, connected to the NAND string and the means for biasing the NAND string, for performing one or more sensing operations on a selected memory cell of the NAND string to determine a hard bit value and a soft bit value, performing a sensing operation on the NAND string to determine whether an amount of residual resistance in the NAND string is above a reference level when the memory cells of the NAND string are in a conducting state, changing the soft bit value in response to determining that the amount of residual resistance in the NAND string is above a reference level when the memory cells of the NAND string are in a conducting state, and using the soft bit value with the hard bit value to determine a data value stored in the selected memory cell.

19. A method, comprising:
performing a read operation on a selected memory cell of a NAND string, the NAND string includes a plurality of non-volatile memory cells connected in series, the read operation includes:
determining a soft bit value for the selected memory cell,
determining a hard bit value for the selected memory cell, and
using the soft bit value with the hard bit value to determine a data value stored in the selected memory cell, the soft bit value provides information on the quality of the hard bit value;
biasing the memory cells and the select gates of the NAND string to a conducting state independent of a programming level of the memory cells;
with the memory cells and the select gates of the NAND string biased to the conducting state independent of the programming level of the memory cells, determining whether a residual in the NAND string is greater than a reference threshold; and
in response to determining that the residual in the NAND string is greater than the reference threshold, changing the soft bit value of the selected memory cell prior to determining the data value stored in the selected memory cell.

20. The method of claim 19, wherein the read operation further includes:
performing an error correction code (ECC) operation for the selected memory cell using the hard bit value and the changed soft bit value.

21. The method of claim 19, wherein determining whether the residual resistance in the NAND string is greater than the reference threshold is performed prior to performing the read operation on the selected memory cell.

* * * * *